US009585282B1

(12) United States Patent
Gandhi et al.

(10) Patent No.: US 9,585,282 B1
(45) Date of Patent: Feb. 28, 2017

(54) TRANSVERSE CONSOLE SWITCH BRIDGE

(71) Applicant: Amazon Technologies, Inc., Reno, NV (US)

(72) Inventors: Jignesh Gandhi, Ashburn, VA (US); Gregg Minolli, Chelan, WA (US)

(73) Assignee: Amazon Technologies, Inc., Reno, NV (US)

(*) Notice: Subject to any disclaimer, the term of this patent is extended or adjusted under 35 U.S.C. 154(b) by 226 days.

(21) Appl. No.: 14/297,505

(22) Filed: Jun. 5, 2014

Related U.S. Application Data

(60) Provisional application No. 61/987,453, filed on May 1, 2014.

(51) Int. Cl.
G06F 1/16 (2006.01)
H02G 3/04 (2006.01)
H05K 7/14 (2006.01)

(52) U.S. Cl.
CPC ............ H05K 7/1485 (2013.01); G06F 1/16 (2013.01)

(58) Field of Classification Search
CPC . G06F 13/4022; H05K 7/1492; H05K 7/1497; H05K 7/1488; H05K 7/18; H05K 7/20709; H05K 1/185; H05K 5/0021; H05K 5/0247; H05K 7/14
USPC ........ 709/220, 201, 219, 223; 211/182, 194, 211/26; 361/679.02
See application file for complete search history.

(56) References Cited

U.S. PATENT DOCUMENTS

| | | | |
|---|---|---|---|
| 5,969,292 A * | 10/1999 | Snider, Jr. ............ | H02G 3/0443 174/498 |
| 6,365,830 B1 * | 4/2002 | Snider, Jr. ............ | H02G 3/0456 174/484 |
| 6,424,781 B1 | 7/2002 | Puetz et al. | |
| 6,452,809 B1 | 9/2002 | Jackson et al. | |
| 6,515,224 B1 | 2/2003 | Pedro | |
| 6,606,253 B2 | 8/2003 | Jackson et al. | |
| 6,628,009 B1 * | 9/2003 | Chapel ..................... | H02J 3/26 307/14 |

(Continued)

OTHER PUBLICATIONS

Power Point Presentation, "Designing a Scalable Network Infrastructure", Dr. Natheer Khasawneh, Rafat A. Dasan, 2007, pp. 1-31.

(Continued)

*Primary Examiner* — Courtney Smith
*Assistant Examiner* — Michael Matey
(74) *Attorney, Agent, or Firm* — Robert C. Kowert; Meyertons, Hood, Kivlin, Kowert & Goetzel, P.C.

(57) ABSTRACT

A just-in-time data center cabling infrastructure is installed incrementally and concurrently with incremental changes in computing capacity in a data center. Based at least in part upon a determination to install one or more rack computer systems in a row of rack positions of the data center, a network switch device can be installed in the row, linked with a network zone via fiber optic cable connections, and linked to rack computer systems via patch cable connections. The fiber optic cables and patch cables are installed in the data center concurrently with installation of the rack computer system. A transverse bridge spans over an aisle space between opposite rows and includes console switch devices. The console switch devices, installed concurrently with one or more rack computer systems in the rows, enable remote access to console systems in the rack computer systems.

20 Claims, 11 Drawing Sheets

(56) References Cited

U.S. PATENT DOCUMENTS

| | | | |
|---|---|---|---|
| 6,718,370 B1 | 4/2004 | Coffman et al. | |
| 7,103,504 B1 | 9/2006 | McGlaughlin et al. | |
| 7,113,991 B1* | 9/2006 | Miyamoto | H05K 7/1428 361/724 |
| 7,143,410 B1 | 11/2006 | Coffman et al. | |
| 2002/0141720 A1 | 10/2002 | Halgren et al. | |
| 2003/0002261 A1 | 1/2003 | Berry et al. | |
| 2003/0016515 A1 | 1/2003 | Jackson et al. | |
| 2003/0179987 A1 | 9/2003 | Gage et al. | |
| 2004/0073816 A1* | 4/2004 | Hansen | G06F 1/26 713/300 |
| 2004/0264112 A1* | 12/2004 | Koehler | H05K 7/1457 361/600 |
| 2007/0055765 A1* | 3/2007 | Lisiecki | G06F 17/3089 709/223 |
| 2007/0061233 A1 | 3/2007 | Jovanovic et al. | |
| 2008/0265722 A1* | 10/2008 | Saliaris | G06F 1/181 312/223.1 |
| 2009/0116178 A1* | 5/2009 | Champion | G06F 1/189 361/624 |
| 2009/0234613 A1* | 9/2009 | Brey | G01B 21/00 702/130 |
| 2009/0256512 A1* | 10/2009 | Begun | H05K 7/20209 318/471 |
| 2009/0261214 A1* | 10/2009 | Beauchamp | G06F 1/181 248/74.1 |
| 2010/0157516 A1* | 6/2010 | Doorhy | H04L 41/0806 361/679.02 |
| 2011/0100668 A1* | 5/2011 | Syed | G06F 1/18 174/50 |
| 2012/0295486 A1* | 11/2012 | Petersen | G06F 1/00 439/658 |
| 2014/0148944 A1* | 5/2014 | Bailey | B07C 3/00 700/224 |
| 2014/0241203 A1* | 8/2014 | Elson | H04L 41/12 370/254 |
| 2015/0098177 A1* | 4/2015 | Wilcox | H05K 7/1492 361/679.31 |
| 2015/0181770 A1* | 6/2015 | Keisling | H05K 7/20745 454/184 |
| 2015/0355630 A1* | 12/2015 | Cader | G05B 15/02 700/9 |

OTHER PUBLICATIONS

Cisco Blogs, "Curse You, UCS", Douglas Alger, Jun. 1, 2011, pp. 1-3.

Cisco, "Design for a Productive Data Center", Douglas Alger, May 2007, pp. 1-2.

U.S. Appl. No. 14/297,503, filed Jun. 5, 2014, Jignesh Gandhi.

* cited by examiner

1

TRANSVERSE CONSOLE SWITCH BRIDGE

PRIORITY INFORMATION

This application claims benefit of priority to U.S. Provisional Patent Application No. 61/987,453, filed May 1, 2014 titled "DATA CENTER INFRASTRUCTURE," which is hereby incorporated by reference herein in its entirety.

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Because a computing facility may contain a large number of servers, a large amount of electrical power may be required to operate the facility. In addition, the electrical power is distributed to a large number of locations spread throughout the computer room (e.g., many racks spaced from one another, and many servers in each rack). Usually, a facility receives a power feed at a relatively high voltage. This power feed is stepped down to a lower voltage (e.g., 110V). A network of cabling, bus bars, power connectors, and power distribution units, is used to deliver the power at the lower voltage to numerous specific components in the facility.

Because a computing facility may contain a large number of servers, a large amount of infrastructure may be required to support computing capacity of the data center. In particular, a large amount of cabling infrastructure may be required to communicatively couple servers in a data center to communication networks, etc. Such cabling infrastructure is usually installed at initial construction of a data center as part of structured cabling infrastructure which is designed and installed in a data center to support server racks (also referred to hereinafter as "rack computer systems") that may be installed in the data center in the present or in the future.

The amount of computing capacity needed for any given data center may change rapidly as business needs dictate. Most often, there is a need for increased computing capacity at a location. Initially providing computing capacity in a data center, or expanding the existing capacity of a data center (in the form of additional servers, for example), is resource-intensive and may take many months to implement. Substantial time and resources are typically required to design and build a data center (or expansion thereof), install cabling infrastructure, install racks, structural support infrastructure, and cooling systems to implement waste heat removal therefrom. Additional time and resources are typically needed to conduct inspections and obtain certifications and approvals, such as for electrical and HVAC systems.

Figure 1A:
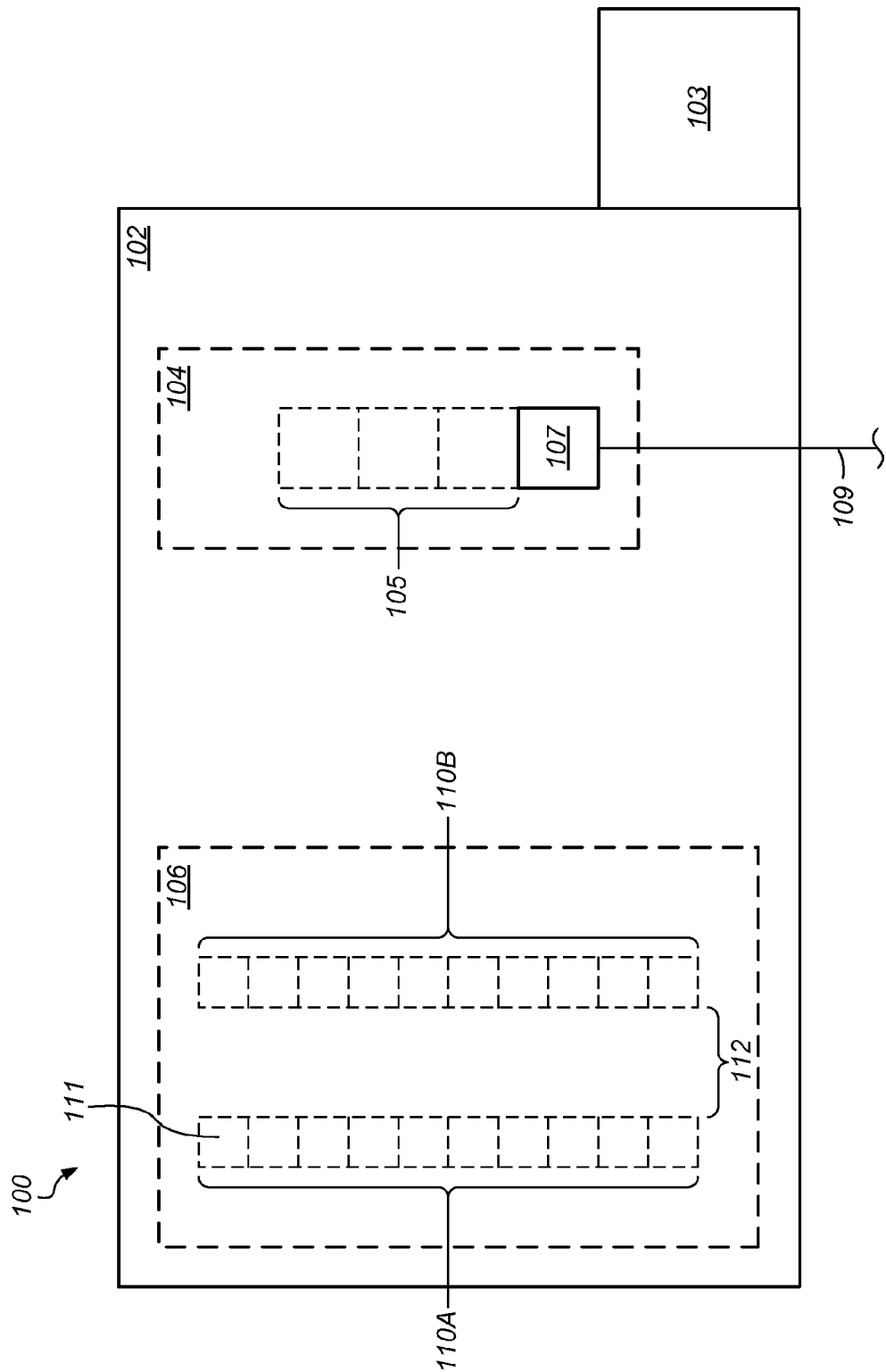
FIG. 1A-D are schematic diagrams illustrating a data center in which rack computer systems and network switch devices are installed via just-in-time infrastructure, according to some embodiments.

The various embodiments described herein are susceptible to various modifications and alternative forms. Specific embodiments are shown by way of example in the drawings and will herein be described in detail. It should be understood, however, that the drawings and detailed description thereto are not intended to limit the disclosure to the particular form disclosed, but on the contrary, the intention is to cover all modifications, equivalents and alternatives falling within the spirit and scope of the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of a system and method for installing rack computer systems in a data center via just-in-time infrastructure are disclosed.

According to one embodiment, a data center includes a network row, which includes a main distribution frame communicatively coupled to a communication network, and a row of rack positions in which a rack computer system can be communicatively coupled to the communication network via just-in-time cabling. Each row includes a network switch device installed in a rack position, where the network switch device is communicatively coupled with the main distribution frame via just-in-time fiber optic cable connections, and communicatively coupled to at least one rack computer system via a just-in-time direct patch cable connection. The network switch device is communicatively coupled via the just-in-time fiber optic cable connection based at least in part upon a determination that at least one rack computer system is to be installed in the row. The network switch device is communicatively coupled via the just-in-time patch cable connection, based at least in part upon the rack computer system being installed in at least one rack position in the row to communicatively couple the at least one rack computer system with the communication network.

According to one embodiment, a data center row infrastructure module includes a system that includes a network switch device, installed in at least one rack position of a row of rack positions in a data center, based at least in part upon a determination that a rack computer system is to be installed in at least one other rack position of the rack positions. The network switch device communicatively couples the rack computer system with a communication network via just-in-time cabling. The network switch device communicatively couples with a remote main distribution frame, located external to the row of rack positions and communicatively coupled with the communication network, via a fiber optic cable connection which extends between the network switch device and the remote main distribution frame, based at least in part upon the determination that the at least one rack computer system is to be mounted in at least one of the rack positions. The network switch device also communicatively couples with the rack computer system via a just-in-time patch cable connection which is extended between the at least one rack computer system and the network switch device, based at least in part upon the rack computer system being mounted in the at least one other rack position, to at least partially install the at least one rack computer system in at least one other rack position.

According to one embodiment, a method includes providing just-in-time cabling to communicatively couple a rack computer system with at least a remote main distribution frame in a data center. The providing includes mounting a network switch device in at least one rack position in a row of rack positions, based at least in part upon a determination that at least one rack computer system is to be installed in at least one other rack position in the row of rack positions. The providing also includes extending a fiber optic cable connection between the network switch device and the remote main distribution frame, based at least in part upon the network switch device being mounted in the at least one rack position, to communicatively couple the network switch device with the main distribution frame.

According to one embodiment, a data center includes at least two rows of rack computer systems extending along opposite side ends of an aisle space and a transverse bridge spanning over the aisle space between the at least two rows above an upper elevation of the rack computer systems in each row. The transverse bridge includes a cable tray structure spanning over the aisle space between the at least two rows. The transverse bridge includes a plurality of mini-racks coupled to the cable tray structure, wherein each of at least two of the plurality of mini-racks comprises at least one console switch device configured to enable remote access to console systems of rack computer systems installed in a separate one of the at least two rows of rack computer systems.

According to one embodiment, a system includes a transverse bridge which spans between rows of rack computer systems. The transverse bridge includes a bridge structure configured to span over an aisle space between the at least two rows and at least one mini-rack coupled to the bridge structure. The mini-rack includes a console switch device that can enable remote access to console systems of rack computer systems installed in the rows of rack computer systems.

According to one embodiment, a method includes configuring a portion of a data center to enable remote access to a console system of a rack computer system installed in one of the at least two rows of rack positions. The portion of the data center includes at least two rows of rack positions extending along opposite side ends of an aisle space. Configuring the portion of the data center includes mounting a transverse bridge to span over the aisle space between the rows of rack positions and coupling at least one mini-rack to the transverse bridge and communicatively coupling at least one console switch device included in the at least one mini-rack to the at least one rack computer system.

As used herein, an "aisle" means a space next to one or more racks.

As used herein, "computing" includes any operations that can be performed by a computer, such as computation, data storage, data retrieval, or communications.

As used herein, "computer room" means a room of a building in which computer systems, such as rack-mounted servers, are operated.

As used herein, "computer system" includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers and other systems and components dedicated to specific functions (e.g., e-commerce transactions, database management) or serving multiple functions. Examples of computer operations include information processing, communications, simulations, and operational control.

As used herein, "room" means a room or a space of a structure. A "computer room" means a room in which computer systems, such as rack-mounted servers, are operated.

As used herein, a "space" means a space, area or volume.

As used herein, a "module" is a component or a combination of components physically coupled to one another. A module may include functional elements and systems, such as computer systems, racks, blowers, ducts, power distribution units, fire suppression systems, and control systems, as well as structural elements, such a frame, housing, structure, container, etc. In some embodiments, a module is prefabricated at a location off-site from a data center.

In some embodiments, a data center is configured to install rack computer systems to provide computing capacity for the data center. The rack computer systems can be installed such that the rack computer systems are mounted in a particular position and are coupled to one or more of a power source and a communication network, via Just-In-Time (JIT) cabling infrastructure that enables JIT installation of computing capacity and infrastructure in the data center.

As used hereinafter, "Just-In-Time" (JIT) refers to a system where elements are provided to meet a demand concurrently with the manifestation of that demand. Under such a system, the elements are not provided in surplus or in advance of such manifestation of demand. Such a system can result in reduced inventory, reduced excesses in capacities, etc. As used herein, JIT installation can refer to installing an element concurrently with a determination of a need for the element to be installed to satisfy demand. Such demand for computing capacity can include presently-occurring demand. In some embodiments, such demand can include demand which is projected to be presently-occurring concurrently with the future installation of the element. For example, where installation of an element requires approximately 5 consecutive days of elapsed time to complete, JIT installation of the element can include installing a quantity of an element in response to a determination that demand that will occur in approximately 5 days' time will require the element to be installed to satisfy that demand. In some embodiments, a JIT installed element is not installed prior to such a determination. JIT installation of an element can include ordering the element to be delivered to a site for installation. As used herein, installation of elements, in amounts that correspond to the demand or need for such elements, may be referred to as "incremental" installation of such elements.

As an example of JIT installation of an element, JIT installation of computing capacity in a data center can refer to installing a certain number of rack computer systems which would provide a certain amount of computing capacity in a data center, concurrently with a determination that the certain amount of computing capacity will be required to satisfy demand for computing capacity at the data center which will occur approximately concurrently with the installation of the rack computer systems in the data center. In other words, JIT installation of rack computer systems can include installing rack computer systems in response to a determination that there is a need for such computing capacity to satisfy a demand for such computing capacity that will occur concurrently with installation of those rack computer systems. JIT installation of rack computer systems can include installing the rack computer systems in response to a determination that the above demand is presently-occurring. For example, where a data center is constructed to accommodate 20 rows of server racks and installation of such racks is determined to require 2 days of time, and five racks' worth of computing capacity is determined to be needed to satisfy computing capacity demand for the data center in approximately 2 days' time, five racks can be installed in the data center in response to such a determination. Additional racks can be installed, replaced, removed, etc. as the needed computing capacity changes over time.

In some embodiments, JIT installation refers to installing an element which is configured to support another element, concurrently with JIT installation of the other element. For example, JIT installation of infrastructure can include the infrastructure in a data center being installed incrementally and concurrently with installation of computing capacity in the data center, which can include JIT installation of computing capacity. Therefore, JIT infrastructure can be installed to support incremental installation of computing capacity in response to a determination that the incremental computing capacity is needed. In some embodiments, JIT infrastructure is installed subsequent to the above determination and concurrently with receipt and installation of the rack computer systems which provide the computing capacity at the data center.

Similarly to JIT installation of computing capacity, where the computing capacity installed is incremental and can provide an amount of computing capacity that satisfy the determined need for computing capacity, the JIT infrastructure can be installed incrementally and in a scale that corresponds to the incremental computing capacity being installed and which is to be supported by the JIT infrastructure. Similarly to the JIT installation of computing capacity being an installation of a minimally-sufficient amount of rack computer systems to provide the needed computing capacity, the JIT infrastructure installed can be a minimally-sufficient infrastructure to support the incremental computing capacity being installed. In some embodiments, JIT infrastructure is installed concurrently with the infrastructure being needed to support incremental changes in computing capacity in the data center, and not before the incremental change in computing capacity is determined to be needed. As a result, the infrastructure for a data center need not be installed upon initial completion of the data center, such that excess infrastructure is present immediately upon completion of the data center and remains unused in the data center until the needed computing capacity increases to utilize the excess infrastructure.

JIT infrastructure, in some embodiments, includes JIT cabling infrastructure, which can refer to one or more instances of communication cabling, power cabling, networking devices which support such cabling, etc., which can be installed incrementally in the data center concurrently with incremental changes in desired computing capacity in the data center over time to require such incremental changes in installed cabling to support incremental changes in computing capacity in the data center. Networking devices can include network switch devices, console switch devices, etc. In some embodiments, installing JIT infrastructure concurrently with changes in the desired computing capacity includes installing infrastructure to structurally, communicatively, and electrically support one or more rack computer systems based at least in part upon a determination that the one or more rack computer systems are to be installed to provide an incremental change in computing capacity for the data center, are ordered or en-route to being delivered to the data center, are delivered and are in preparation for installation in the data center, are mounted in a particular position in the data center, etc.

JIT cabling, in some embodiments, includes cabling which is installed incrementally to support computing capacity concurrently with the computing capacity being added in the data center, via installation of rack computer systems in the data center, and in increments configured to support the incrementally added computing capacity. For example, where a number of rack computer systems are to be installed in a data center, JIT cabling that can communicatively support the number of rack computer systems can be installed in an increment which can provide the support needed to communicatively support that number of rack computer systems. The increment of installed JIT cabling can include JIT cabling which is minimally sufficient to communicatively support that number of rack computer systems, is installed in the data center concurrently with the number of rack computer systems being installed. Communicative support can refer to supporting communications between the supported element and one or more various external elements. For example, cabling infrastructure which communicatively couples a rack computer system with a communication network via a main distribution frame communicatively supports the rack computer system. JIT cabling can include various cabling which is installed "Just in Time", concurrently with installation of a rack computer system in a data center to communicatively support the rack computer system. For example, a patch cable connection which extends between an interface of the rack computer system and an interface of another component to establish a "direct patch cable connection" and is installed in the data center concurrently with installation of the rack computer system in the data center may be referred to as a just-in-time (JIT) direct patch cable connection between the rack computer system and the component. Such a component can include a network switch device, which can be installed, as part of JIT infrastructure, concurrently with the determination that the rack computer system is to be installed to satisfy demand. In another example, a fiber optic cabling connection which extends between respective interfaces of respective components, including an interface of a network switch device and an interface of a main distribution frame, to establish a "fiber optic cable connection", and is installed in the data center concurrently with installation of the one or both of the components in the data center, may be referred to as a just-in-time (JIT) fiber optic cable connection between the two components. Such a fiber optic cable connection may be direct, such that the fiber optic cable connection is via a single instance of fiber optic cable cabling between respective interfaces of the two components. Such a fiber optic cable connection may be indirect, such that the fiber optic cable connection is via multiple instances of the fiber optic cabling, which may be communicatively coupled via one or more interfaces in one or more intermediary components between the two components.

Additional JIT infrastructure, including structural infrastructure, cold aisle and hot aisle containment, infrastructure routing structures, communication and power support, etc. can be installed concurrently with installation of rack computer systems to provide the amount of additional support required to support the installed rack computer systems when the rack computer systems are installed. As used hereinafter, installing JIT infrastructure "concurrently" with installation of rack computer systems can refer to installing the infrastructure in response to determination that the rack computer systems are to be installed. Such installation can occur after the determination and prior to the mounting of the rack computer systems in position in the data center, in response to the rack computer systems arriving at the data center, in response to the rack computer systems being mounted in position, etc.

In some embodiments, JIT infrastructure installation includes installing network communication support infrastructure in increments concurrently with a determination of a need for such increments of support infrastructure. Network communication support can include network switching support provided by one or more network switch devices. As a result, JIT infrastructure installation concurrently with rack computer system installation can include installing one or more network switch devices in the data center concurrently with a rack computer system being installed, where the rack computer system is coupled to the installed network switch devices to communicatively couple the rack computer system with a communication network via a network zone in the data center. As used hereinafter, a network zone refers to a region of the data center in which a main networking trunk is located, and can include one or more main distribution frames, demarcation racks, etc.

In some embodiments, JIT infrastructure installation includes incrementally installing console communication support in a data center concurrently with a determination of a need for such increments of support to support incremental changes in computing capacity in the data center. Console communication support enables remote access to console systems of rack computer systems, switch devices, etc. in the data center and can include out-of-band (OOB) access to such rack computer systems, switch devices, etc. As a result, installing console communication support can include installing one or more console switch devices, OOB management devices, etc. concurrently with installation of one or more rack computer systems in the data center.

In some embodiments, JIT infrastructure installation includes installing cabling in the data center to provide communicative and power support to a rack computer system concurrently with the rack computer system being installed in the data center. Such installing of cabling can include installing just enough cabling to support the installed rack computer system, such that additional cabling is installed concurrently with each rack computer system installed in the data center. Such JIT cabling can preclude cabling infrastructure designs that are established and at least partially installed prior to determinations that the support provided by the cabling infrastructure is needed to support present computing capacity.

JIT cabling infrastructure can include cabling which can be installed incrementally and can preclude prefabricated cabling assemblies, including some or any structured cabling, copper trunk assemblies, which may be designed to provide excess support than may be needed to support incremental changes in data center computing capacity. For example, JIT cabling infrastructure can include patch cables, Ethernet cables, etc. which can directly link support equipment to rack computer systems over short to moderate distances, while fiber optic cables can link rack computer systems to the network zone, directly or via one or more sets of support equipment. Such cabling, in some embodiments, can be installed in increments that correspond to concurrent changes in desired computing capacity in the data center. For example, patch cables can link a rack computer system to a network switch concurrently with the rack computer system being mounted in a position in the data center, and the patch cables need not be installed until such mounting occurs. In addition, fiber optic cables can be installed in the data center to link a network switch device, console switch device, etc. with the network zone concurrently with installation of such switch devices in one or more positions in the data center.

In some embodiments, providing JIT infrastructure support to rack computer systems in a data center includes providing JIT network communication support infrastructure, concurrently with one or more rack computer systems being mounted in a data center, which communicatively couples the one or more rack computer systems to one or more communication networks. Such JIT infrastructure provision can include responding to a determination that a rack computer system is to be installed in the data center by installing one or more networking devices proximate to a position in the data center in which the rack computer systems are to be installed. For example, where a data center includes a region for which one or more rows of rack positions are defined in which one or more rack computer systems can be installed, JIT infrastructure installation can include responding to a determination that a rack computer system is to be installed in one of the positions in the one or more rows by installing a networking device in another one of the positions in the rows. Such a networking device can include a network switch device.

In some embodiments, installing a network switch device in a row of rack positions can include coupling the network switch device to the various rack computer systems mounted in the various positions in the row via a direct connection. For example, a patch cable can be routed from a rack computer system installed in a position in a row to couple with a network switch device installed in another position in the row to communicatively couple the rack computer system with at least the network switch device. Installing a network switch device in one or more positions in a row, based at least in part upon a determination that one or more rack computer systems are going to be installed in other positions in the row, can include routing one or more fiber optic cable connections between the network switch device and the network zone to communicatively couple the network switch device with a communication network. As a result, patching a direct patch cable connection from an installed rack computer system to an installed network switch device can include communicatively coupling the rack computer system with the communication network via at least the network switch device.

In some embodiments, a network switch device in a row of rack positions is linked exclusively to rack computer systems installed in the same row. In some embodiments, a network switch device can be linked with one or more rack computer systems installed in other rows via one or more jumper devices, so that excess capacity at the network switch device can be utilized by rack computer systems in other rows where a local network switch device is exhausted of capacity.

In some embodiments, installing a network switch device in a rack position in the row of positions enables communicative coupling of rack computer systems in the row with one or more communication networks independently of prefabricated cabling assemblies, copper trunk assemblies etc. For example, a fiber optic cable connection, including a single-mode connection, multi-mode connection, etc. can be sufficient to enable communication between the rack computer systems in the row and the network, and fiber optic cables can be installed as needed (just-in-time), rather than being installed as an assembly prior to the capacity of the assembly being fully required in the data center, thereby mitigating waste. Furthermore, fiber optic cable connections between the network switch device in a row of rack computer systems and the network zone can be less than the cost of a copper trunk assembly extending from the network zone to one or more separate rows of rack computer systems or open rack positions.

In some embodiments, a network switch device can be installed in various positions in a row of rack positions. Certain positions may be more desirable for network switch device installation than others. For example, installing a network switch device at a central rack position, which can include one or more positions which are approximately equally distal from end positions at the end of a row, can enable the network switch device to be coupled to rack computer systems mounted adjacent to either side of the network switch device via patch cables having a length that is substantially less than the full length of the row. A patch cable coupling a network switch device installed in a central position with a rack computer system mounted at an end position may have a length which is approximately half the length of the row, which may be the maximum patch cable length required to couple rack computer systems in any position in the row with the installed network switch device. As a result, shorter patch cables can be used to couple the network switch device installed in a central position with rack computer systems mounted in the row. In addition, less variation of patch cables can be needed, as patch cables of a common length can couple rack computer systems coupled on either side of a centrally-installed network switch device.

In some embodiments, JIT infrastructure installation includes installing one or more console switch devices in a region in which one or more rows of rack computer systems can be installed. Console switch devices, by being installed proximate to a row of rack positions in which one or more rack computer systems, network switch devices, automatic transfer switch (ATS) assemblies, etc. may be installed, can be linked with the rack computer systems, network switch devices, ATS assemblies, etc. directly via one or more patch cable connections, network cable connections, etc., rather than cabling of more substantial length as might be required if the console switch devices were installed in a network zone that is remote from the rows of rack computer systems. Similarly to a network switch device installed in a row, installing a console switch device can include linking the console switch device to equipment in the network zone, including a master console router, master OOB management device, etc., via one or more fiber optic cable connections, rather than via prefabricated assemblies. As a result, the cabling infrastructure required to support a console switch device can be installed in the data center concurrently with the console switch device being installed proximate to one or more rows of rack computer systems, rack positions, etc. For example, where a data center includes rack computer systems which comprise an Ethernet switch included in the rack, pursuant to a "Top of Rack" design, a console switch device can be communicatively coupled an interface to the "Top of Rack" switch of the rack, one or more console system interfaces ("console ports"), etc. based at least in part upon the rack computer system being mounted in a rack position in the aisle space in which the console switch device is located. Such communicative coupling can include couple a network cable, at one interface, connector, port, etc. at one end of the cable to a communication interface, connector, port, etc. of the console switch device and extending the cable to couple an interface at the opposite end of the cable to an interface of the mounted rack computer system. Such communicative coupling can be part of "installing" a mounted rack computer system, so that the rack computer system is communicatively coupled to at least one or more communication networks.

Communicatively coupling the rack computer system via JIT infrastructure can include coupling the network cable to the console switch and extending the cable to couple with the rack computer system concurrently with the mounting of the rack computer system in the rack position, so that the cable is not coupled to the console switch prior to at least a determination that the particular rack computer system is to be installed in the rack position. As a result, infrastructure is added to the data center to provide an incremental amount of communicative support that corresponds to an incremental addition of computing capacity, and such infrastructure is incrementally added when it is needed to support the added computing capacity, and not before. Thus, the presence of excess support capacity and infrastructure in the data center can be minimized. In some embodiments, the incremental installation of infrastructure, including installing console switch devices, cabling, etc. concurrently with installing one or more rack computer systems, results in there being no excess or unused cabling infrastructure in a data center. In some embodiments, minimizing the presence of excess infrastructure, support costs associated with constructing and supporting the data center are minimized.

In some embodiments, a console switch device installed in a region in which one or more rows of rack computers can be installed is installed in a transverse bridge which is mounted in an aisle space through which two or more rows of rack computer systems can be installed on opposite side ends of the aisle. The transverse bridge can be mounted in the aisle "traverse" to the rows of rack positions in which the rack computer systems can be installed, so that the bridge spans at least the aisle space. In some embodiments, the transverse bridge spans the aisle in an elevated position in the aisle space, so that the transverse bridge spans over the rack positions of one or more of the rows on opposite side ends of the aisle space and further spans over rack computer systems, network switch devices, etc. installed in the rack positions.

In some embodiments, the transverse bridge comprises a bridge structure which structurally supports components included in the transverse bridge, including racks supporting one or more console switch devices, cables extending between components in the transverse bridge and external coupled components, etc. The bridge structure can include one or more structures suitable to provide structural support to the components, including or more cable tray structures, basket structures, support frames, etc. A cable tray structure can include a structure with a U-shaped cross-section, having a bottom end and opposite side ends, which extends along the long axis of the bridge structure across the aisle space. Components may be coupled to the side ends of the cable tray structure, and cables may be routed and supported along the bottom end. Cables may be routed into and out of the bridge structure via open spaces in the bridge structure, including open spaces enabling communication between the upper surface of the bottom end of the bridge structure and a lower surface of the bottom end.

In some embodiments, an aisle space can include one or more sets of cable trays which each extend along one or more rows of rack positions in the aisle space. A set of cable trays can support and route cables between various components installed in the rack positions with other components mounted in the rack positions, components external to the rack positions, components external to the aisle space, etc. A set of one or more cable trays extending along a given row of rack positions may extend in an elevated position above the row, so that the set of cable trays extends above rack computer systems, network switch devices, etc. installed in the rack positions. In some embodiments, where an aisle space includes two rows of rack positions extending along opposite side ends of the aisle, separate sets of cable trays extend above each separate row of rack positions, and the transverse bridge is coupled at opposite ends to the separate sets of cable trays and spans over the aisle space between the two separate sets of cable trays.

In some embodiments, the transverse bridge is coupled to structural elements that establish a portion of the aisle space. For example, where an aisle space is bounded on side ends by structures that each enclose separate enclosures which can receive exhaust air discharged from rack computer systems installed in proximate rack positions on the same side end of the aisle space as the structure, the transverse bridge can be coupled at opposite ends to the separate structures and spans over the aisle space between the two separate structures that bound side ends of the aisle space. The structural elements can be part of JIT infrastructure installed in a data center to establish a computer zone, aisle space, one or more rows of rack positions, some combination thereof, or the like concurrently with a determination that one or more rack computer systems are to be installed in the data center, so that the rack computer systems, which may be in transit to the data center at the time of the determination, can be installed in one or more rack positions in the aisle space established at least in part by the structures concurrently with receipt of the rack computer systems at the data center.

In some embodiments, one or more console switch devices installed in a transverse bridge structure are mounted in a "mini-rack" which is coupled to a portion of the bridge structure of the transverse bridge. As referred to herein, a "mini-rack" refers to a rack in which computer systems, including servers, console switch devices, networking devices, communication interfaces, etc. can be mounted. Some mini-racks are configured to accommodate components having a height corresponding to one standard rack unit, known as U pursuant to Electronic Industry Standard (EIA)-310. A mini-rack can include a rack which can accommodate a limited selection of components relative to racks comprised in rack computer systems installed in a data center, based at least in part upon having a reduced height relative to the racks installed in the data center. For example, a rack computer system may comprise a rack which can accommodate a selection of components having a total height in the rack of 42 rack units (42 U), while a mini-rack may comprise a rack which can accommodate a selection of components having a total height in the rack of 4 rack units (4 U). In addition, while a rack comprised in a rack computer system may be configured to be mounted to a rack position on a horizontal floor space, a mini-rack may be configured to be coupled to a vertical surface, structure, etc. and exclusively of a horizontal surface, so that at least a portion of the coupled mini-rack is coupled in a position that is suspended above an open space above the horizontal floor space. A mini-rack, in some embodiments, includes a two-post rack. In some embodiments, where the bridge structure includes vertically-oriented side ends, a mini-rack is coupled to one or more of the side ends.

In some embodiments, a transverse bridge includes one or more power distribution units which distribute power, received from an external power source, to one or more of the components included in the transverse bridge. For example, a power distribution unit, which can receive operating power from one or more external power sources, is coupled to the bridge structure of a transverse bridge and distributes the received operating power to one or more components installed in mini-racks coupled to the bridge structure, which can include one or more console switch devices, OOB management devices, routers, networking devices, computer systems, etc. In some embodiments, where the transverse bridge includes console switch devices, installed in separate mini-racks coupled to the bridge structure, which are communicatively coupled to rack computer systems in separate rows of rack positions and thus provide remote console access to separate rack computer systems in separate rows of the aisle space, the power distribution unit distributes power to console switch devices that are each communicatively coupled to separate rows of rack computer systems, thereby providing operating power to the separate console switch devices via a common power distribution chain. In some embodiments, the power distribution unit is mounted in a mini-rack coupled to the bridge structure.

In some embodiments, the power distribution unit receives operating power from an upstream component which is installed in one or more rack positions in the aisle space in which the transverse bridge that includes the power distribution unit is installed. Such an upstream component can include an automatic transfer switch (ATS) assembly, one or more of which can be included in a cabinet that is installed in a rack position in a row in the aisle space. In some embodiments, the ATS assembly is installed in an end rack position at one end of the row of rack positions, thereby mitigating the exposure of other rack computer systems installed in other rack positions in the row to the ATS assembly. A power transmission line can be routed from the ATS assembly to the power distribution unit in the transverse bridge to supply operating power to the power distribution unit. The ATS assembly can selectively distribute power received from one or more external power sources to the power distribution unit. In some embodiments, the external power sources include a primary power source and a secondary power source, so that the ATS assembly provides N+1 power support redundancy to the components in the transverse bridge via the power distribution unit in the transverse bridge. In some embodiments, the power distribution unit received operating power from a power busway which extends through the aisle space, which can include a busway which extends along the aisle space above the transverse bridge, such that power is received at the power distribution unit via a power transmission line which extends from the busway to the power distribution unit.

In some embodiments, where a transverse bridge includes one or more "bridge mini-racks" in which one or more console switch devices, OOB management devices, etc. are installed, and one or more mini-racks in which one or more power distribution units are installed, the bridge mini-racks are coupled to one side of the transverse bridge, and the power distribution unit is coupled to the opposite side of the transverse bridge.

In some embodiments, a transverse bridge is installed in a row of rack positions, included in the network zone, in which one or more demarcation point racks, main distribution frames, etc. are installed (such a row is also referred to as a "network row"). Such a transverse bridge can enable patch cables to be routed between various components installed in the network zone and other components external to the network zone. Such a transverse bridge may be absent of mini-racks, console switch devices, etc.

In some embodiments, providing JIT infrastructure support to rack computer systems in a data center includes installing one or more communication interfaces proximate and external to a row of rack positions in which one or more rack computer systems can be installed, where the communication interface can communicatively couple with one or more components in the network zone of the data center, including a main distribution frame and can also communicatively couple with the one or more rack computer systems installed in the row to communicatively couple the rack computer systems to one or more communication networks. The communication interface, which can include a fiber optic communication interface, can be coupled with various components in the network zone via one or more fiber optic cables which are extended from one or more portions of the communication interface, which can include one or more fiber optic communication ports, to one or more interfaces of one or more components in the network zone, which can include one or more fiber optic communication ports in one or more of a main distribution frame, master OOB console, master console router, some combination thereof, or the like.

In some embodiments, the communication interfaces are installed in one or more mini-racks which are coupled to a portion of an aisle space proximate to one or more rows of rack positions, where rack computer systems installed in the rack positions of the row can be communicatively coupled to the communication interfaces in the mini-racks. Where one or more of the communication interfaces include a fiber optic communication interface, one or more of the mini-racks may be referred to as a fiber mini-rack. Where a cable tray extends above a row of rack positions, the mini-racks may be coupled to a portion of the cable tray. The rack computer systems may be communicatively coupled via an indirect connection. For example, the rack computer systems can be communicatively coupled to a network switch device installed in the row via one or more direct patch cable connections with one or more interfaces of the network switch device, and the network switch device may be communicatively coupled to the one or more communication interfaces in the mini-racks via one or more fiber optic cable connections with one or more of the interfaces.

Connections to a network switch device can be established concurrently with the network switch device being installed in the row, where a fiber optic cable can be extended from a fiber optic port in one or more of the fiber mini-racks to couple with a port on the network switch device. As a result, cabling infrastructure to communicatively couple the rack computer systems to at least the network zone can be restricted to short-length cables which couple the rack computer systems to components (network switch devices, fiber mini-rack) within an aisle space, while a relatively smaller number of longer-length cables couple the fiber mini-rack to components in the network zone, thereby reducing the cumulative length and amount of cabling which would be required to extend connections from each individual rack computer system to components in the network zone. Furthermore, the incremental infrastructure cabling necessary to communicatively couple a rack computer system to the network zone, which can include patch cabling to a network switch, need not be installed until concurrently with the installation of the rack computer system in a rack position, thereby minimizing excess infrastructure in the data center. In some embodiments, a fiber mini-rack is coupled to a cable tray, aisle space structure, etc. proximate to a network switch device installed in a row of rack positions, thereby minimizing the length of cabling needed to communicatively couple the rack computer systems to the one or more communication interfaces in the mini-rack.

FIG. 1A-D are schematic diagrams illustrating a data center in which rack computer systems and network switch devices are installed via just-in-time infrastructure according to some embodiments.

Data Center 100 includes an interior enclosure 102 in which data center components, including rack computer systems, can be installed and a receiving area 103 which, in some embodiments, comprises a loading dock at which equipment to be installed in the enclosure 102 can be received from external sources. Enclosure 102 includes portions, also referred to as "regions" or "zones" associated with various particular data center components. Particularly, enclosure 102 includes a network zone 104 and a server zone 106, also referred to as hereinafter as a "computer zone". Network zone 104 can include various components which can communicatively couple the various rack computer systems installed in the data center with one or more communication networks. Such components can include one or more main distribution frames, demarcation point racks, master OOB devices, master console routers, etc. Computer zone 106 can include various rack computer systems which provide computing capacity for the data center 100.

FIG. 1A illustrates data center 100 in a state of initial construction, where rack computer systems have yet to be installed in the data center 100. In the illustrated state of data center 100, server zone 106 includes an aisle space 112 which is established by two rows 110A-B of rack positions 111 which extend along opposite side ends of aisle space 112. In some embodiments, the locations of at least some rack positions and aisle spaces in the data center enclosure 102 are undefined where rack computer systems are not installed in those rack positions and aisle spaces.

Network zone 104 includes a row of rack positions 105 in which network zone components can be installed. Rack positions 111 and 105 can correspond, in size, dimensions, etc. with various types of known computer rack designs, including standard 19-inch racks, 23-inch racks, etc. pursuant to EIA-310 standards, and various known rack designs. In the illustrated embodiment of FIG. 1A, a single network zone component, main distribution frame (MDF) 107, is installed in a network zone position 105 in network zone 104. MDF 107 is communicatively coupled with at least one communication network via a communication pathway 109, which can include a wired network connection, wireless network connection, some combination thereof, or the like.

As shown in the illustrated embodiment, data center 100 in a state of initial construction lacks rack computer systems and infrastructure, including structural support infrastructure, cabling infrastructure, power support infrastructure, etc., to support at least rack computer systems.

Figure 1B:
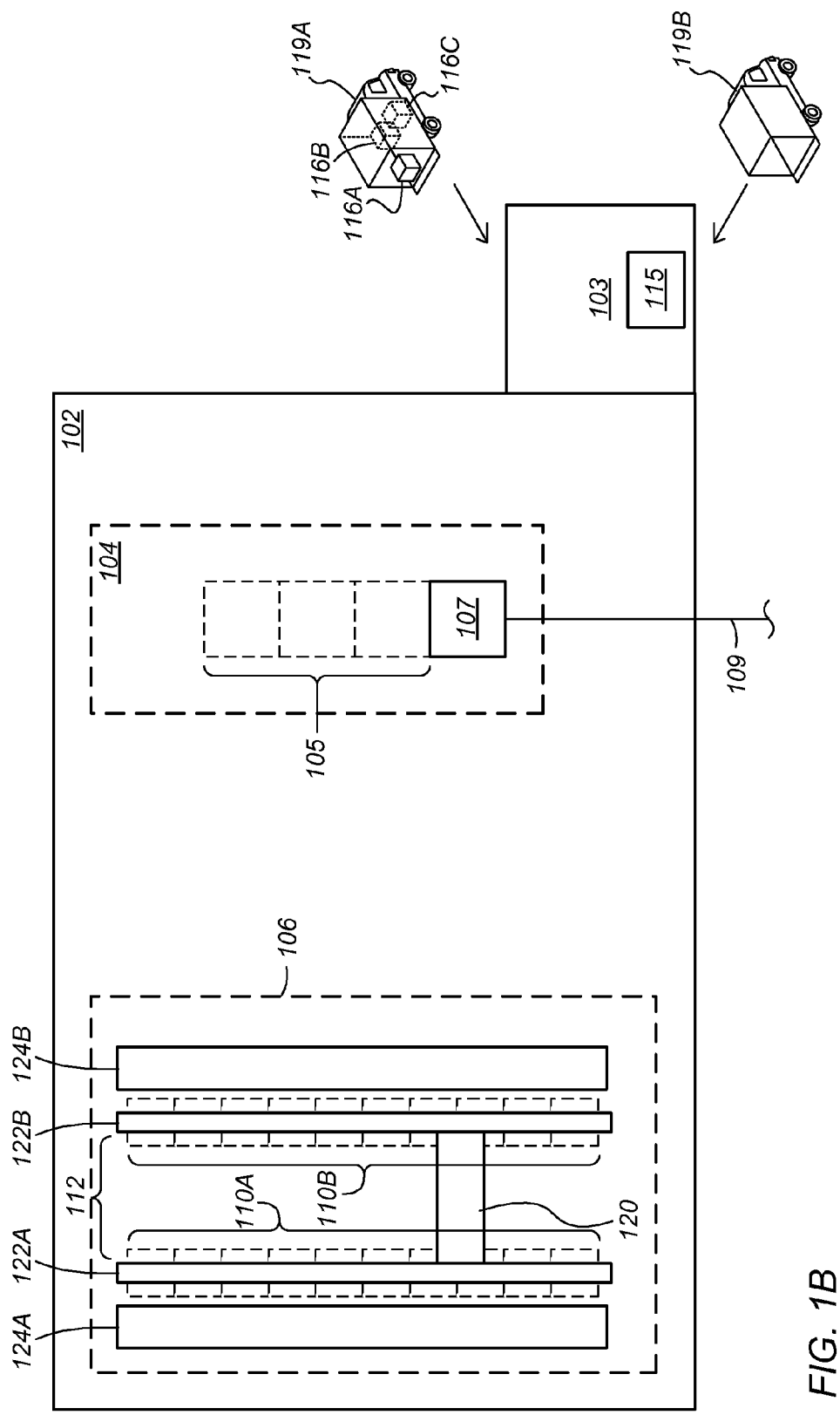

FIG. 1B illustrates data center 100 in a state where a determination is made that one or more rack computer systems are to be installed in the data center 100. Particularly, FIG. 1B shows rack computer systems 116A-C presently in the process of being delivered to data center 100 at receiving area 103. Such rack computer systems can be delivered via various delivery methods, including by delivery truck. In the illustrated embodiments, rack computer systems 116 are in-transit via inbound delivery truck 119A to receiving area 103.

In some embodiments, where a determination is made that a certain amount of computing capacity is to be added to data center 100, one or more rack computer systems 116 that provide at least the desired computing capacity can be ordered for delivery to the data center 100. Where the data center 100 initially lacks supporting infrastructure for such rack computer systems, JIT infrastructure to support the ordered rack computer systems may be installed in data center 100 in response to the determination, concurrently with the determination, etc. For example, in the illustrated embodiment, where rack computer systems 116A-C are inbound for delivery to data center 100 via truck 119A, at least some infrastructure that provides at least some support to an installed rack computer system is installed in the data center 100. Such infrastructure may not be installed in data center 100 until rack computer systems 116 are ordered for delivery, in-transit, delivered to data center 100, some combination thereof, or the like.

In the illustrated embodiment of FIG. 1B, where rack computer systems 116 are inbound, infrastructure is installed in server zone 106 to at least partially support the rack computer systems 116 when the rack computer systems are installed. For example, structures 124A-B, which can include structural support infrastructure which includes interior exhaust enclosures configured to receive and direct exhaust air from installed rack computer systems installed in rack positions in one of rows 110A-B out of server zone 106, are installed proximate to respective rows 110A-B of rack positions 111, so that an installed rack computer system can discharge exhaust air into a proximate exhaust structure 124. In addition, cable trays 122A-B can be installed in zone 106 to extend over separate respective rows 110A-B of rack positions. Each cable tray 122A-B can be coupled to the proximate structure 124A-B. In addition, in the illustrated embodiment, a bridge structure 120 of a transverse bridge can be installed in server zone 106 to span across aisle space 112 and above rack positions 111.

In some embodiments, at least some infrastructure which is installed based at least in part upon a determination that rack computer systems are to be installed in the data center comprises infrastructure that is minimally sufficient to support the rack computer systems are is installed concurrently with the installation of the rack computer systems. Such infrastructure may be referred to as JIT infrastructure, as the infrastructure is installed in the data center as needed and "just in time" to support the installed rack computer systems and is "just" enough to support the installed rack computer systems. In the illustrated embodiment, where the inbound rack computer systems 116 are to be installed in one or more rack positions 111 where rack computer systems are not previously installed, exhaust structures 124 and cable trays 122 and transverse bridge are installed exclusively for the aisle space including the row of rack positions in which the rack computer systems are to be installed. The rack position in which an inbound rack computer system is to be installed may be determined prior to installation of an ordered rack computer system, and at least some supporting infrastructure, including JIT infrastructure, is installed for the determined rack position, a row or selection of rows including the rack position, etc. subsequent to the determination that the rack computer system is to be installed in the data center.

In some embodiments, a network switch device is ordered for delivery to data center 100 based at least in part upon the determination that rack computer systems 116 are to be installed in data center enclosure 102 and a determination that at least one network switch device is required to be installed in data center enclosure 102 to communicatively couple the rack computer systems 116 to the network zone. As a network switch device is not initially installed in enclosure 102, a network switch device may be required to support an installed rack computer system in enclosure 102. As shown, a network switch device 115 is in-transit via inbound delivery truck 119B transportation to receiving area of data center 100. As shown in FIG. 1B, infrastructure configured to communicatively couple components to be installed in rack positions 111 to network zone 104 components, including MDF 107, are absent from enclosure 102. For example, structured cabling configured to communicatively couple server zone 106 components to network zone 104 components is absent from enclosure 102.

Figure 1C:
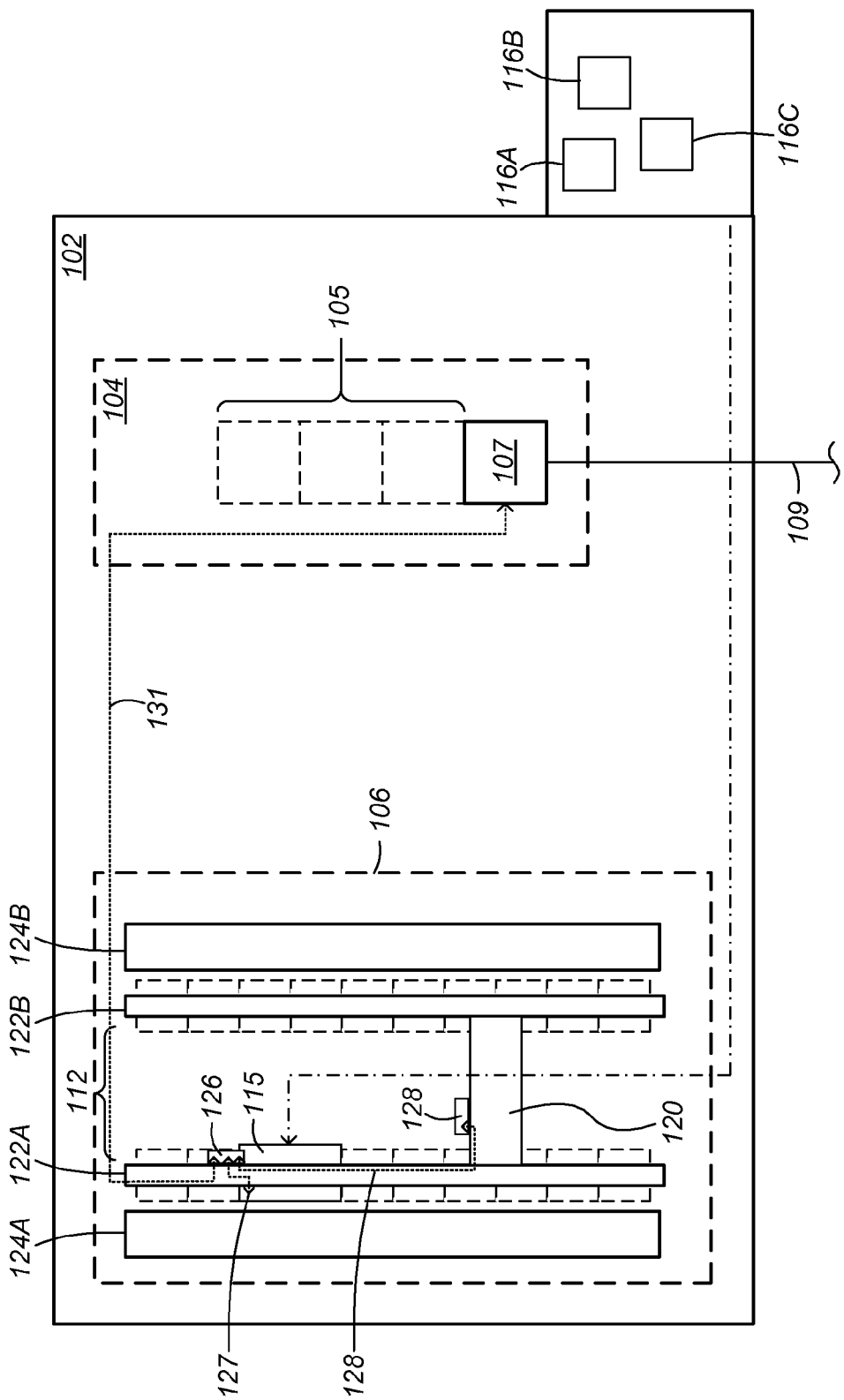

FIG. 1C illustrates data center 100 in a state where ordered rack computer systems to be installed in data center 100 are received at the data center 100 and one or more network switch devices 115 are installed in a portion of the server zone 106 in which the rack computer systems 116 are to be installed. Network switch device 115 is installed in one or more rack positions 111 in server zone to provide communicative support to the rack computer systems when the rack computer systems are installed in the server zone 106. As shown, network switch device 115 can be installed in multiple rack positions 111, including the illustrated two adjacent rack positions 111. The network switch device may be installed in a certain portion of the server zone, including proximate to a central portion of a row 110A in which the rack computer systems 116 are to be installed.

As shown, in some embodiments the network switch device 115 is installed in server zone 106 concurrently with rack computer systems 116 being installed in rack positions 111. For example, network switch device may be installed in rack positions 111 in a row 110A in response to rack computer systems 116 being ordered for delivery and installation. In another example, network switch device 115 may be installed in rack positions 111 in response to the rack computer systems 116 being received at the data center 100.

In some embodiments, at least some cabling infrastructure is installed in data center 100 in response to network switch device being installed in data center 100. Such installation can include mounting the network switch device 115 in one or more rack positions 111, electrically coupling the network switch device to one or more power sources, communicatively coupling the network switch device 115 to MDF 107, some combination thereof, or the like. In some embodiments, cabling infrastructure that communicatively couples the network switch device 115 to MDF 107 is installed subsequent to network switch device 115 being mounted in server zone 106 and concurrently with rack computer systems 116 being mounted in rack positions 111.

In some embodiments, communicatively coupling a network switch device 115 with MDF 107 concurrently with installation of rack computer systems 116 in the data center 100 includes extending a fiber optic cable connection from an interface of the network switch device to an interface of the MDF. The fiber optic cable connection may be extended in response to installation of the network switch device 115 in the data center enclosure 102, so that such a connection is just-in-time and does not provide excess communicative support in data center 100. The fiber optic cable connection can be direct between the network switch device 115 and MDF 107.

In some embodiments, the fiber optic cable connection between device 115 and MDF 107 is indirect. For example, a network switch device 115 may be directly connected, via fiber optic cable connection 127, with a fiber optic communication interface installed in a mini-rack 126, referred to hereinafter as a fiber mini-rack, which is coupled to cable tray 122A. Fiber mini-rack 126 can be couple to a portion of cable tray 122A that is proximate to network switch device 115, so that the connection between the network switch device 115 and the fiber mini-rack 126 is minimized in length. A fiber optic cable connection 131 can be extended from the fiber optic communication interface of fiber mini-rack 126 to an interface of MDF 107 to complete the communicative coupling of network switch device 115. The mini-rack 126, fiber optic cable connections 127, 131, etc. can be installed concurrently with network switch device 115, prior to installation of network switch device 115, concurrently with installation of rack computer systems 116, some combination thereof, or the like.

In some embodiments, a console switch device that is configured to provide console access support for at least rack computers systems 116 to be installed in the data center 100 is installed in the server zone 106 concurrently with the rack computer systems 116 being installed. Console switch devices can be installed in one or more "bridge" mini-racks 128 and installed in the aisle space 112 of the server zone 106 by coupling with the transverse bridge 120, so that the bridge mini-rack 128 including the console switch devices is suspended over the aisle space 112. Console switch devices in mini-rack 128 can be communicatively coupled with MDF 106 via communication pathway 129, which can be a fiber optic cable connection, so that console switch devices in mini-rack 128 are communicatively coupled to MDF 107 via communication pathways 131. The mini-rack 128, fiber optic cable connections 129 can be installed concurrently with network switch device 115, prior to installation of network switch device 115, concurrently with installation of rack computer systems 116, some combination thereof, or the like.

Figure 1D:
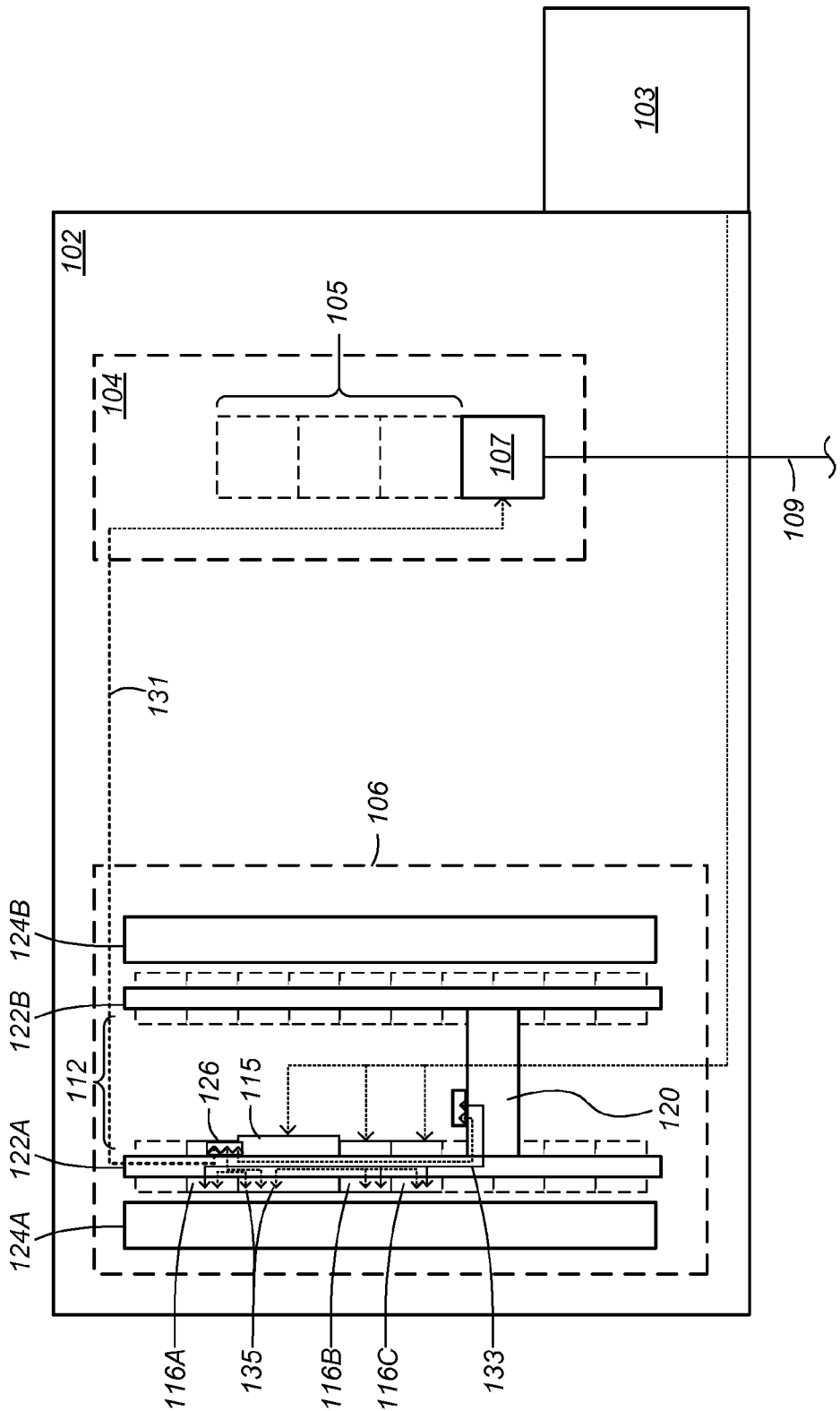

FIG. 1D illustrates data center 100 in a state where rack computer systems 116 received at data center 100 are installed in one or more rack positions 111 in row 110A. Rack computer system 116 can be installed concurrently with the installation of various JIT infrastructure, including cabling infrastructure, network communicative support infrastructure and components, air circulation components and infrastructure, etc.

As shown, rack computer systems 116A-C are installed in rack positions 111 in row 110A. In some embodiments, rack computer systems are installed in rack positions 111 in which no components are presently installed are proximate to an installed network switch device 115.

In some embodiments, including the illustrated embodiment, at least some cabling infrastructure is installed in data center 100 concurrently with the installation of rack computer systems 116 in the data center 100 to communicatively couple the rack computer systems to one or more communication networks. Rack computer systems 116A-C are communicatively coupled with network switch device 115 via direct communication pathways 135, which can include direct patch cable connections between the rack computer systems 116 and the network switch device 115. As network switch device 115 is communicatively coupled with MDF 107 via fiber optic cable connections 126, 131, patching rack computer systems 116 mounted in rack positions 111 to network switch device 115 via one or more direct patch cable connections communicatively couples the rack computer systems 116 to at least the MDF 107, thereby communicatively coupling the rack computer systems 116 to a communication network and enabling network interaction with the rack computer systems 116.

In some embodiments, one or more communication pathways are installed in data center 100, concurrently with rack computer systems 116 being installed in the data center, to communicatively couple the rack computer systems 116 with one or more console switches. As shown, installed rack computer systems 116 are communicatively coupled to the bridge mini-rack in which one or more console switch devices, OOB management devices, etc. are installed, via one or more communication pathways 133, to communicatively couple the rack computer systems to at least a master console router, master OOB device, etc. in network zone 104 via at least communication pathway 131.

In some embodiments, the cabling infrastructure installed concurrently with the installation of rack computer systems 116 in data center 100 is free from copper cable connections. For example, communication pathways 135 can be patch cable connections, and communication pathways 126, 131, 133 can be fiber optic cable connections.

Figure 2:
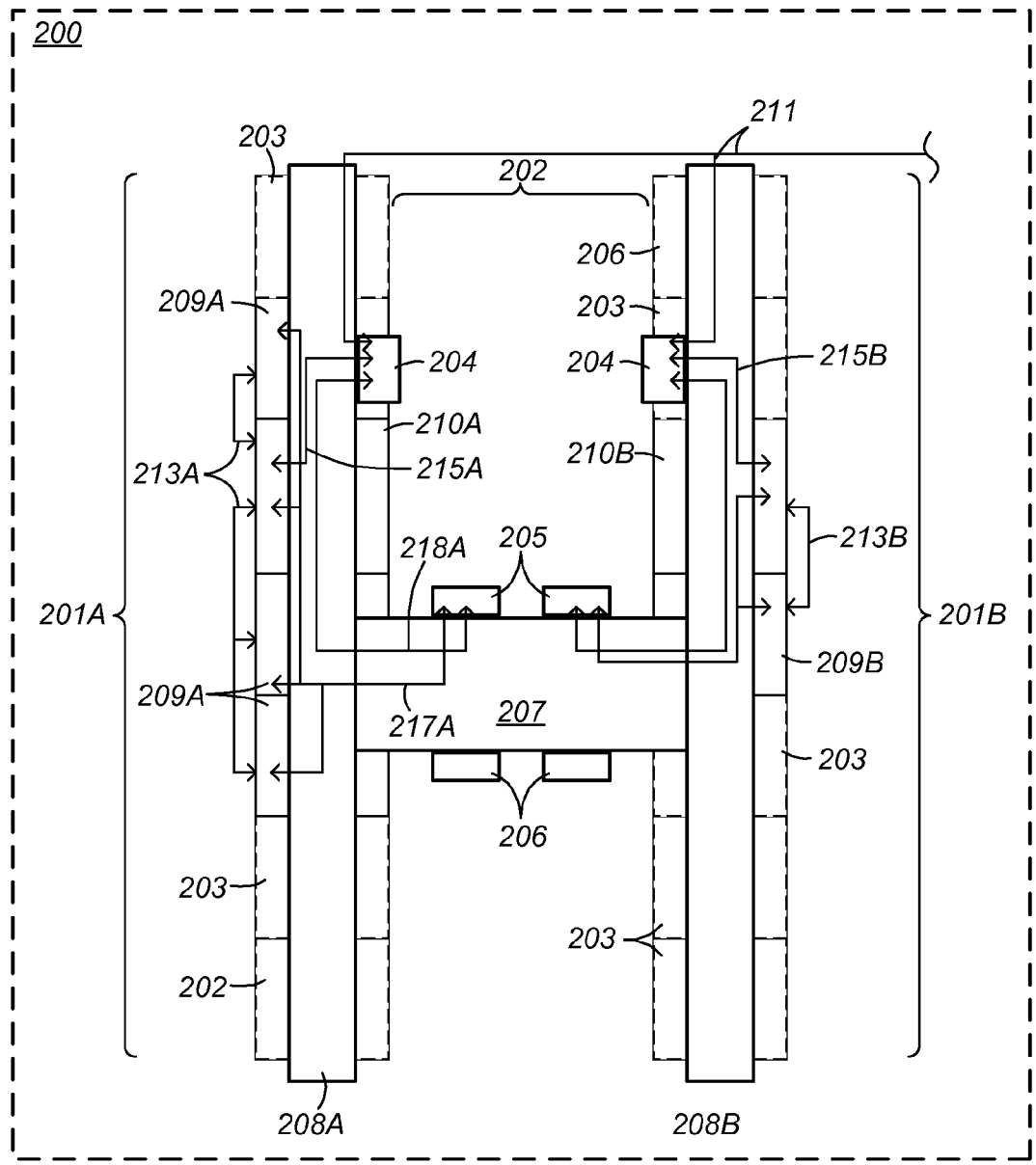
FIG. 2 is a schematic diagram illustrating a data center computer zone in which equipment is communicatively coupled via just-in-time infrastructure, according to some embodiments.

FIG. 2 is a schematic diagram illustrating a data center computer zone in which equipment is communicatively coupled via just-in-time infrastructure according to some embodiments.

Computer zone 200 includes aisle space 202 and rows 201A-B of rack positions 203 extending along opposite side ends of aisle space 202. Various components, including the illustrated rack computer systems 209A-B and network switch devices 210A-B, are mounted in various rack positions 203; other rack positions 203 are empty. In some embodiments, computer zone 200 is at least partially comprised in at least computer zone 106, illustrated and described above with reference to FIG. 1A-D.

Cabling infrastructure is installed in computer zone 200 to communicatively couple components installed in rack positions 203 to one or more external elements, including a remote main distribution frame, to communicatively couple the components to one or more communication networks. The cabling infrastructure can be installed concurrently with the installation of components in the rack positions 203, where the installed cabling infrastructure corresponds with the incremental communication support required to communicatively couple the installed components to the external elements. As shown, network switch devices 210A-B are communicatively coupled with the external elements via respective communication pathways 215A-B with respective mini-racks 204 which include one or more communication interfaces and one or more communication pathways 211 from the mini-racks 204 and the external elements.

The pathways 215, 211 can include one or more fiber optic cable connections and the mini-racks 204 can each include one or more fiber optic communication interfaces. In addition, installed rack computer systems 209A-B are communicatively coupled to the respective network switch devices 210 installed in the same row 201 as the rack computer systems 209 via one or more communication pathways 213A-B. Such communication pathways 213 can include one or more patch cable connections that directly connect a rack computer system with a corresponding network switch device.

In some embodiments, one or more console switch devices are installed in computer zone 200 to provide remote console access to console systems of the rack computer systems 209, network switch devices, 210, etc. of the aisle space. The console switch devices can be installed in mini-racks 205, which can be coupled to a transverse bridge which is installed in computer zone 200 to space across aisle space 202. Communication pathways 219A-B, which can include fiber optic cabling, can be extended from respective mini-racks 205 to respective fiber mini-racks 204 to communicatively couple the console switch devices installed in the mini-racks to one or more external elements via pathways 211. Communication pathways 217A-B, which can include network cabling, patch cabling, etc., can be extended from respective mini-racks 205 to respective rack computer systems 209 and network switch devices 210 installed in rack positions 203 of a separate one of the rows 201A-B. As shown, console switch devices coupled to rack computer systems and network switch devices installed in separate rows of computer zone 200 can be installed in separate mini-racks 205, and such mini-racks can be coupled to a common side of the transverse bridge 207 and an opposite side from mini-racks 206, which can include other components, including one or more power distribution units, as discussed below.

In some embodiments, the transverse bridge 207 is installed at a position which is at least partially distal from the network switch devices 210A-B in the computer zone 200. Such a placement may be determined to at least partially mitigate risk of components included in the transverse bridge from being affected by incidents affecting one or more of the network switch devices 210. Conversely, such a placement may be determined to at least partially mitigate risk of the network switch devices 210 from being affected by incidents affecting one or more of the components included in the transverse bridge 207.

In some embodiments, the various cabling infrastructure 213, 215, 217, 219 are at least partially supported and routed by one or more cable trays 208A-B which extend over respective rows of rack positions 203. In some embodiments, transverse bridge 207 is coupled at opposite ends to the separate cable trays 208A-B and spans over the aisle space 202 between the cable trays 208A-B.

As shown, computer zone 200 does not include cabling infrastructure for each of the rack positions 203, but is restricted to cabling infrastructure for rack positions in which components are installed. As noted above, cabling infrastructure can be installed and extended between components incrementally to particular rack positions, concurrently with incremental installation of components in those rack positions, to provide JIT cabling infrastructure.

Figure 3:
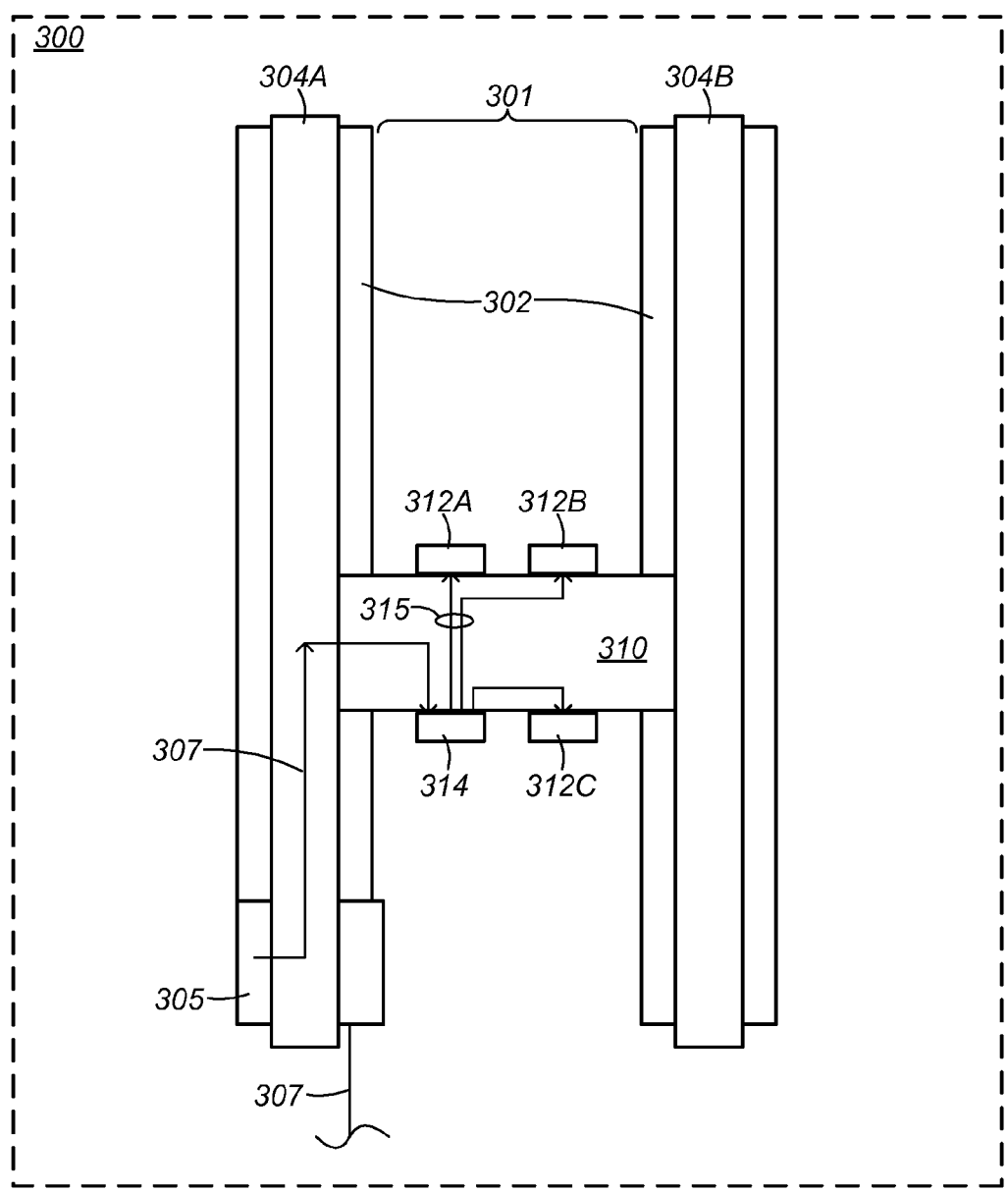
FIG. 3 is a schematic diagram illustrating a data center computer zone including a transverse bridge with equipment that receives power support via a common power circuit, according to some embodiments.

FIG. 3 is a schematic diagram illustrating a data center aisle space including a transverse bridge with equipment that receives power support via a common power circuit according to some embodiments.

Computer zone 300 includes rows 302A-B of rack positions, cable trays 304A-B extending over the separate rows 302A-B extending in separate rows, and a transverse bridge 310 spanning across at least an aisle space 301 between the two rows 302A-B and at least a portion of rack positions in each of the two rows 302A-B. In some embodiments, computer zone 300 is at least partially comprised in at least computer zone 106, illustrated and described above with reference to FIG. 1A-D.

In some embodiments, one or more power distribution components 305 are installed in one or more positions in one or more of the rows 302. A power distribution component 305 can include an automatic transfer switch (ATS) assembly which selectively distributes power, received from one or more external power sources 306, via one or more output power transmission lines 307.

In some embodiments, transverse bridge 310 includes one or more power distribution units which distribute power received from an external power source to various console switch devices, OOB management devices, etc. included in the transverse bridge 310. Such power distribution units can be included in one or more mini-racks coupled to the transverse bridge 310. For example, a power distribution unit (PDU) can be installed in mini-rack 314 and can be coupled to power transmission line 307, so that the PDU in mini-rack 314 receives operating power from ATS assembly 305 via line 307. The PDU in mini-rack 314, in some embodiments, distributes operating power received from ATS assembly 305, via cabling 315, to console switch devices, OOB management devices, etc. installed in mini-racks 312A-B coupled to transverse bridge 310. Therefore, the console switch devices, OOB management devices that provide remote console system access to rack computer systems, network switch devices, etc. in an aisle space 200, including such components installed in separate rows 302A-B, are provided operating power via a common power distribution component: the PDU included in mini-rack 314.

At least some of the cabling 307, 315 is extended to mini-racks 312 based at least in part upon the console switch devices, OOB management devices, etc. being installed in the mini-racks 312, the mini-racks 312 being coupled to the transverse bridge 310, etc.

Figure 4:
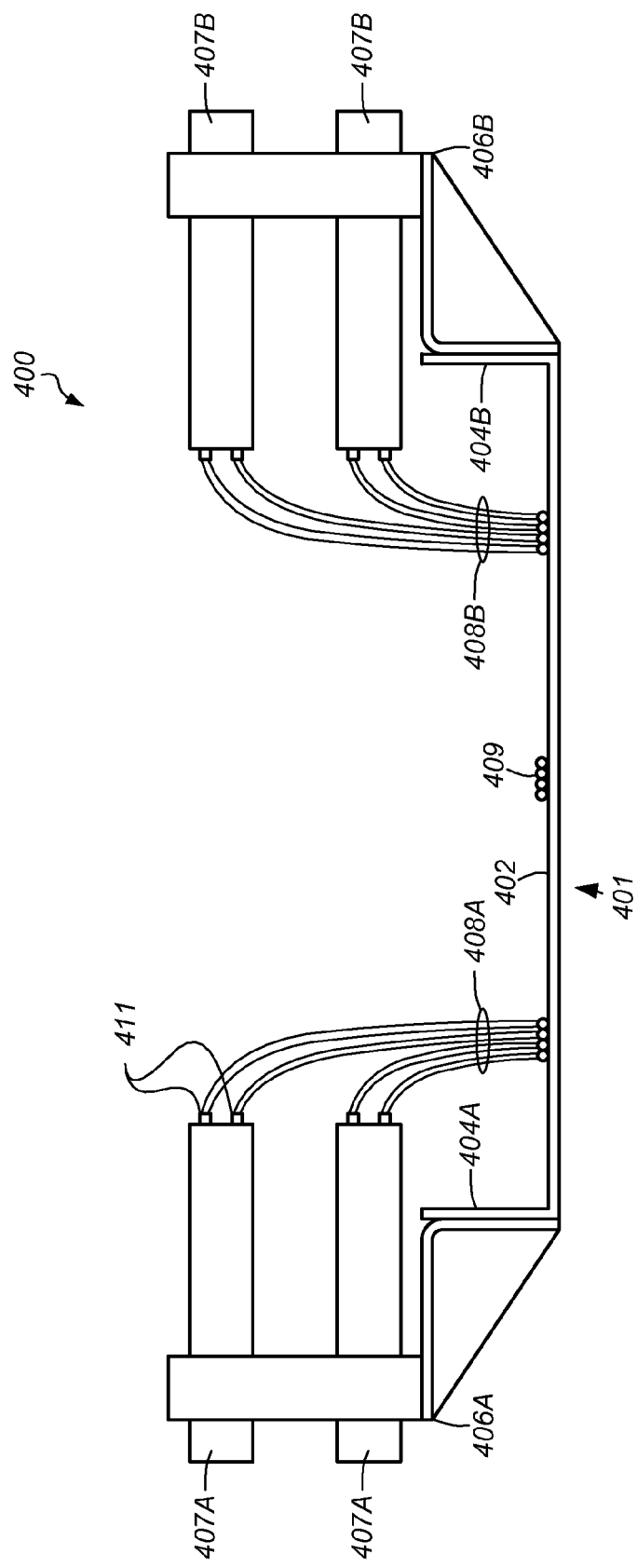
FIG. 4 is a cross sectional view of a transverse bridge, according to some embodiments.

FIG. 4 is a cross sectional view of a transverse bridge according to some embodiments. Transverse bridge 400 includes a transverse bridge structure 401, a cross sectional view of which is illustrated in FIG. 4. Bridge structure 401 includes a bottom end 402 and opposite side ends 404A-B. In some embodiments, transverse bridge 400 is at least partially comprised in one or more of the transverse bridges 120, 207, 310, illustrated and described above with reference to one or more of FIG. 1-3.

In some embodiments, one or more mini-racks that include one or more various components can be coupled to a portion of the transverse bridge structure. Such a coupled mini-rack can enable the included components to be installed in various positions in a data center based on the installation of the transverse bridge in the data center. For example, installing a transverse bridge to span across an aisle space in an elevated position enables the components to be installed in an elevated suspended position above the aisle space.

In the illustrated embodiment, for example, transverse bridge 400 includes two mini-racks 406A-B coupled to opposite side ends 404A-B of the bridge structure 401. It will be understood that one or more mini-racks can, in some embodiments, be coupled to one or more portions of the bridge structure, including the bottom end 402. As further shown, each mini-rack 406 includes a respective set of components 407A-B installed in the respective mini-rack 406. In some embodiments, one or more components 407 installed in a mini-rack coupled to a bridge structure, where such a mini-rack can be referred to hereinafter as a "bridge mini-rack", can include a console switch device, OOB management device, router, network switch device, power distribution unit, some combination thereof, or the like.

Each component 407 can be installed in a particular mounting position in the respective mini-rack 406 in which the component is installed. Installing such a component can include mounting the component in the mini-rack, such that the mini-rack provide structural support to the component and supports at least some of the structural load of the component, and communicatively coupling the mounted component to one or more communication pathways. For example, in the illustrated embodiments, components 407A-B are each mounted in respective mini-racks 406A-B and are each coupled, at respective communication interfaces 411, to one or more communication pathways 408A-B, which can include one or more cables, bus bars, etc.

Interfaces 411 can include one or more power interfaces, communication interfaces, etc. For example, an interface 411 can include one or more of an Ethernet port, Universal Serial Bus (USB) interface, fiber optic cable interface, power outlet interface, power inlet interface, etc. The pathways 408A-B, as shown, can extend along a portion of the transverse bridge 400, including an upper surface of the bottom end 402 as shown, to one or more locations external to the transverse bridge 400. For example, where components 407A-B are console switch devices communicatively coupled to one or more network zone components, including a master console router, master OOB management device, etc. and also communicatively coupled to one or more rack computer systems, pathways 408 can include patch cables that extend from one or more component interfaces 411, which can include one or more communication ports, Ethernet ports, USB ports, fiber optic communication ports, patch cable ports, etc., along an upper surface of bottom end 402 to rack computer systems external to the bridge 400 and fiber optic cables that extend from one or more component interfaces 411, along the upper surface of bottom end 402 to a fiber optic communication interface external to the bridge 400.

In some embodiments, transverse bridge 400 supports various communication pathways extending over an aisle space in a data center. For example, where the transverse bridge is installed in a server zone, network zone, etc. such that the bridge 400 spans between two opposite rows of components installed on opposite sides of an aisle space, bridge 400 can support one or more communication pathways 409, which can include communication cabling, power distribution lines, etc., across the aisle space between the two opposite rows of components.

Figure 5:
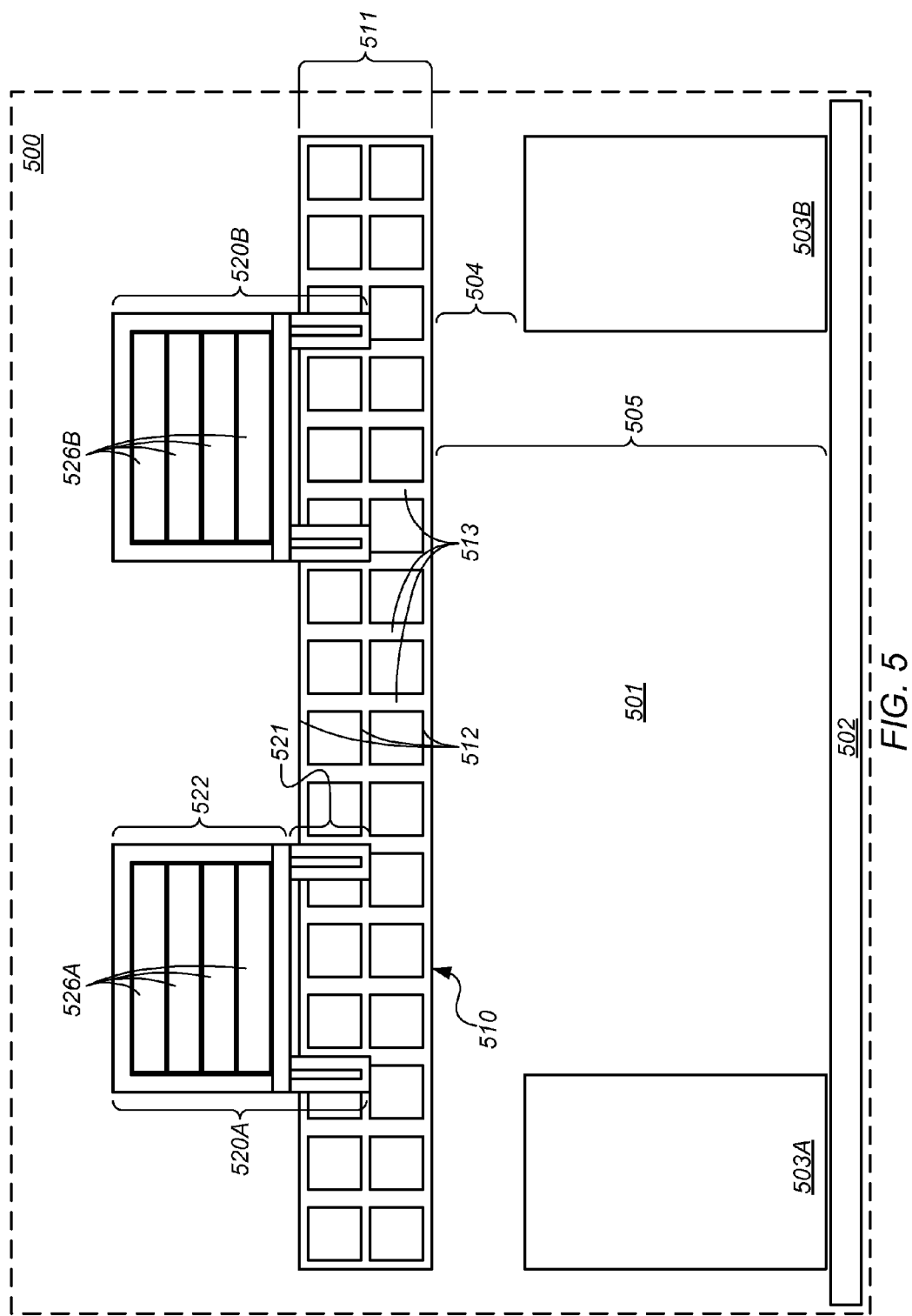
FIG. 5 is a view of an aisle space in which a transverse bridge is installed, according to some embodiments.

FIG. 5 is a cross-sectional view of a computer zone in which a transverse bridge is installed, according to some embodiments. Computer zone 500 includes an aisle space 501, extending perpendicularly to the illustrated view, above a floor element 502 on which components 503A-B, which can include rack computer systems, network switch devices, etc., are installed on opposite side ends of the aisle space 501. Transverse bridge 510 is installed in the computer zone 500 in an elevated position that spans across and aisle space 501 above the installed components 503A-B by at least some distance 504 and above the floor element 502 by at least some distance 505. In some embodiments, one or more portions of computer zone 500, including transverse bridge 510, is at least partially comprised in one or more of the computer zones 106, 200, 300 and traverse bridges 120, 207, 310, 400, illustrated and described above with reference to one or more of FIG. 1-4.

Transverse bridge 510 includes a bridge structure 511 which spans the length of the bridge 500. In some embodiments, including the illustrated embodiment, bridge structure 511 is comprised of multiple vertical elements 512 and horizontal elements 513 which are coupled together to establish the bridge structure 511. In some embodiments, bridge structure 511 is a cable tray structure.

In some embodiments, including the illustrated embodiment, one or more mini-racks in which one or more components are installed are coupled to one or more portions of the bridge structure of the transverse bridge. As shown in FIG. 4, some mini-racks may be coupled to opposite side ends of a bridge structure, and FIG. 5 shows that, in some embodiments, some mini-racks are coupled to a common side of the bridge structure. In some embodiments, one or more sets of mini-racks, which can include two or more mini-racks, are coupled to each of opposite side ends of the bridge structure. In some embodiments, one or more sets of mini-racks are coupled proximate to opposite sides of the bridge structure. For example, with reference to the embodiments illustrated in FIG. 4-5, two mini-racks can be coupled to each of opposite side ends of a bridge structure, establishing a "2×2" pattern of mini-racks on the transverse bridge. In another example, two separate sets, of two mini-racks each, are coupled to a bottom end of a bridge structure proximate to opposite sides of the bottom end, so that two rows, of two mini-racks each, extend along opposite sides of a bottom end of a bridge structure. As shown, mini-racks 520A-B are both coupled to bridge structure 511. Each of the mini-racks 520 comprises a coupling portion 521 which couples with the bridge structure 511, and transmits the structural load of the respective mini-rack 520 to the bridge structure 511, and a mounting portion 522 which includes one or more mounting positions 526 and structurally supports components installed in the one or more positions 526. Such structural support can include transferring the structural load of the components from the positions 526 to the bridge structure via one or more coupling portions 521.

In some embodiments, a mini-rack includes one or more components installed in the mini-rack in one or more mounting positions in the rack. For example, in the illustrated embodiment, each of mini-racks 520A-B includes four mounting positions 526A-B in which one or more components, including one or more console switch devices, power distribution units, OOB management devices, etc. can be installed. In some embodiments, one or more pass-through boards are installed in a mounting position.

In some embodiments, certain mini-racks are coupled to a portion of the bridge structure in positions that are proximate to one or more various components in the computer zone. For example, as shown, mini-rack 520A is coupled to bridge structure 511 in a position that is proximate to component 503A, and mini-rack 520B is coupled to bridge structure 511 in a position that is proximate to component 503B.

In some embodiments, a transverse bridge, including embodiments illustrated in FIG. 4 and FIG. 5, are installed in a data center independently of JIT infrastructure, including JIT cabling and JIT structural support infrastructure. For example, a transverse bridge can be installed to span across an aisle space between opposite rows of rack positions in a computer zone of a data center, where one or more of the structural support infrastructure associated with the computer zone, cabling infrastructure configured to communicatively couple components installed in the rack positions to a network zone, power distribution infrastructure configured to distribute power to components installed in the rack positions, etc., are installed concurrently with initial construction of a data center, prior to determinations that one or more rack computer systems are to be installed in one or more rack positions in the computer zone, etc.

Figure 6:
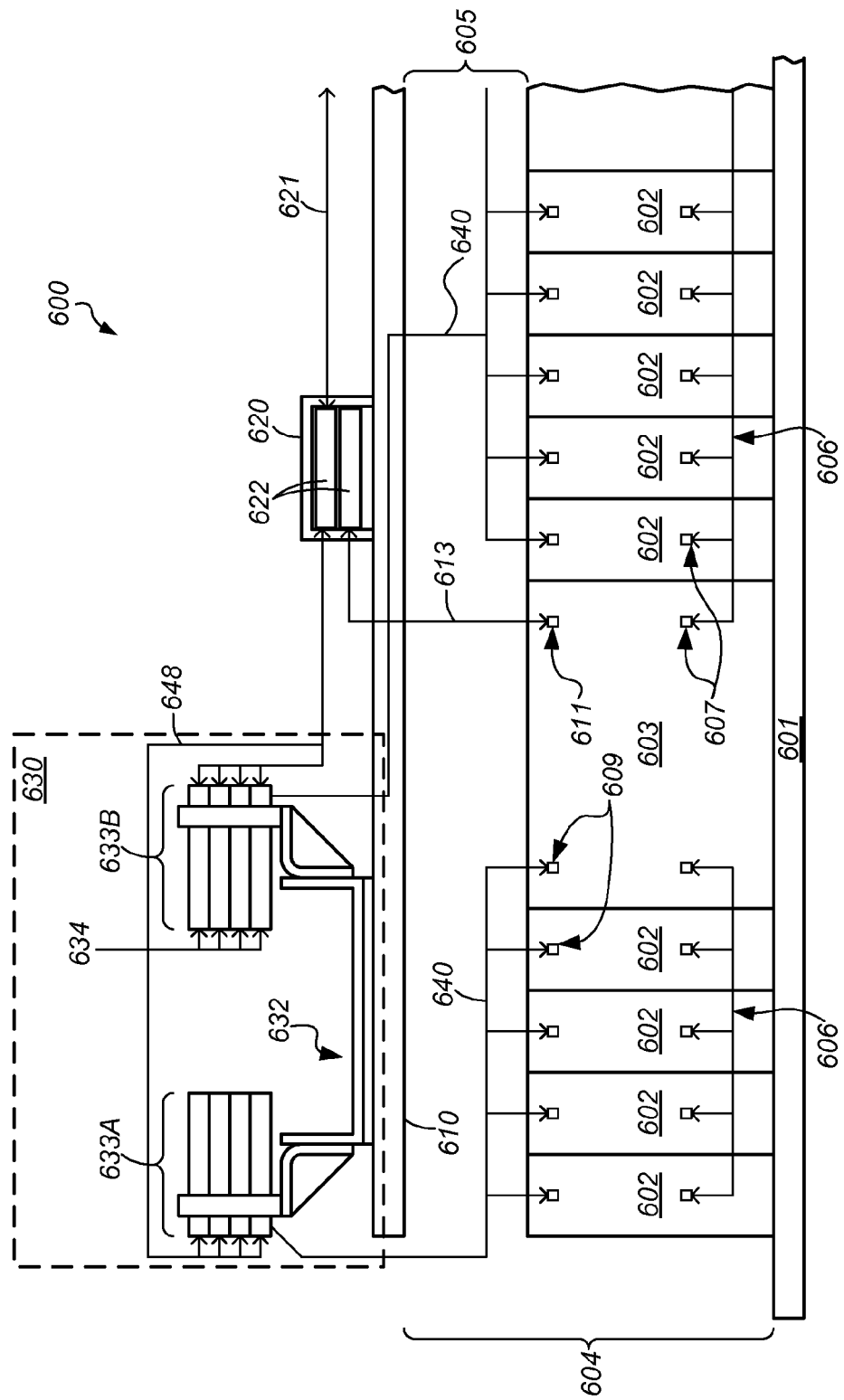
FIG. 6 is a view of a portion of a computer zone in which a transverse bridge and network switch device are installed and communicatively coupled to a remote source according to some embodiments.

FIG. 6 is a view of a portion of a computer zone in which a transverse bridge and network switch device are installed and communicatively coupled to a remote source according to some embodiments.

Computer zone 600 includes an aisle space 604 in which a row of components 602-603 are installed on a floor element 601. Components 602 can each be a rack computer system, which can include a rack of servers, Ethernet switches, etc. Component 603 can be a network switch device which communicatively couples components 602 to a main distribution frame, which is remote from zone 600, of a data center in which zone 600 is located, aggregation area of a data center, communication network through a main distribution frame, etc.

Components 602, 603 each include a network interface 607, which can include an Ethernet communication interface, patch cable communication interface, etc. through which the components 602 are each communicatively coupled with component 603 via respective communication pathways 606 between component 603 and individual respective components 602. Where components 602 are each rack computer systems and component 603 is a network switch device, interfaces 607 can each include a patch cable communication interface, and separate direct patch cable connections between an interface 607 of a rack computer systems 602 and an interface 607 of network switch device 603 communicatively couples the rack computer system 602 to the network switch device 603. Although the illustrated network switch device is shown with only two interfaces 607 for the purposes of clarity, it will be understood that some embodiments of the network switch device include an individual interface 607 for each of components 602, where an individual pathway 606 extends from being engaged with an interface 607 of an individual component 602 to engage with a separate interface 607 of component 603 to communicatively couple the components 602, 603.

Computer zone 600 includes a cable tray 610 which is installed in zone 600 to extend, in an elevated position above the aisle space 604, along and above the row of components 602, 603 by a certain distance 605. Cable tray 610, in some embodiments, supports one or more cables routed between various components in zone 600.

Computer zone 600 includes a mini-rack 620 in which various communication interfaces 622 are installed. As shown, mini-rack 620 is coupled to one or more portions of cable tray 610. Mini-rack 620 can be coupled to a portion of cable tray, including a side end of same, that is proximate to particular components in the zone 600, including component 603. One or more of the communication interfaces 622 installed in the mini-rack can include one or more fiber optic communication interfaces. In such embodiments, where mini-rack 620 may be referred to as a "fiber mini-rack", one or more of the interfaces 622 can be communicatively coupled to one or more components external to the computer zone 600 via one or more communication pathways 621 which can be one or more fiber optic cable connections. Such connections, which can include one or more single-mode (SM) cabling, multi-mode cabling (e.g., OM1, OM2, OM3, OM4, etc.) which can be connected with fiber optic communication interfaces of one or more components external to zone 600 including one or more of a main distribution frame, master console router, demarcation point rack, master OOB management device, etc. which may be installed in a network zone of the data center.

In some embodiments, mini-rack 620 includes a jumper device which can communicatively couple one or more components in zone 600 with one or more components in another computer zone in the data center. For example, such a jumper may communicatively couple one or more rack computer systems 602 in zone 600 with a network switch device in another separate computer zone. Such communicative coupling may be enabled based at least in part upon a determination that the switching capacity of the network switch device 603 in zone 600 is exhausted.

Component 603 includes a communication interface 611 which is communicatively coupled with one or more communication interfaces 622 of mini-rack 620 via pathway 613. In some embodiments, pathway 613 is a fiber optic cable connection between a fiber optic cable interface 611 of component 603 and a fiber optic communication interface 622 of fiber mini-rack 620. In some embodiments, pathways 607, 611, 621 enable installed components 602 in zone 600 to be communicatively coupled with one or more elements external to the computer zone, including a main distribution frame, communication network, etc. via component 602, which can be a network switch device. A pathway 606, which can be a patch cable connection, can be extended between being engaged with respective interfaces 607 of a rack computer system 602 and a network switch device 603 in zone 600 concurrently with the rack computer system 602 being installed in the zone, so that the amount of cabling infrastructure in zone 600 to support communicative coupling of rack computer systems with network switch devices is incrementally added to support incremental changes in the number of rack computer systems in the zone 600 and excess cabling 606 is absent. Similarly, pathways 613 and 621, which can be fiber optic cable connections, can be extended between being engaged with interfaces of respective component 603 and interfaces 622, and interfaces 622 and one or more external elements, respectively. Such pathways can be so extended concurrently with the installation of component 603 and one or more rack computer systems 602 in zone 600, to provide incremental network switching support in a zone 600 of a data center concurrently with installation of incremental computing capacity via installed rack computer systems 602 in the zone 600.

Computer zone 600 includes transverse bridge 630, which includes a bridge structure 632, mini-racks 633A-B coupled to portions of the bridge structure 632, and components 634 installed in the mini-racks 633A-B. The components 634 can include one or more console switch devices, OOB management devices, power distribution units, network switch devices, networking devices, some combination thereof, or the like. In some embodiments, bridge structure 632 is coupled to cable tray structure 610. Transverse bridge 630, in some embodiments, suspends installed components 634 over an open space in computer zone 600 between two rows of components installed on opposite side ends of an aisle space 604.

As shown, components 634 can be communicatively coupled to one or more components 602, 603 in the computer zone and can be communicatively coupled to one or more interfaces 622 in the mini-rack 620. Such communicative coupling, in some embodiments, enables one or more of remote access to one or more console systems in one or more of components 602, 603 by a remote user, out-of-band (OOB) access to one or more of components 602, 603 by a remote user, some combination thereof, or the like.

In an example, where components 634 include console switch devices, and each of components 602, 603 includes at least one console interface 609, which may be referred to as a console port, one or more of the console switch devices 634 can communicatively couple with the one or more of the components 602, 603 via a direct cable connection 640 extended between a communication interface of the console switch device 634 (not shown in FIG. 6) and a console port 609 of the respective component 602, 603. In addition, the one or more console switch devices 634 can be communicatively coupled with one or more communication interfaces 622 of mini-rack 620 via a communication pathway 648 extended between an interface of the console switch device 634 and the interface 622, where pathway 648 can be a fiber optic cable connection, to communicatively couple the console switch device 634 with an external element, which can include a master console router, master OOB management device, main distribution frame, communication network, etc. As a result, a console switch device 634 can enable remote console system access, remote OOB access, etc. to one or more components 602, 603 in zone 600 by one or more remote computer systems via pathways 621, 648, 640.

In some embodiments, one or more of pathways 640, 648 are installed concurrently with installation of one or more components 602, 603, 634 in zone 600. For example, an individual component 634 may be installed in a mini-rack 633 concurrently with installation of an individual rack computer system 602 in zone 600, where the incremental console system access support provided by the console switch device 634 is determined to be required for the infrastructure of zone 600 to provide remote console access support for the concurrently installed rack computer system 602. Pathway 640 can include a patch cable which is extended between a console switch device 634 and a component 602, 603 concurrently with installation of one or more of the device 634 or component 602, 603 in zone 600. Pathway 648 can be extended between one or more devices 634 and interfaces 622 concurrently with installation of one or more devices 634, components 602, 603 requiring support by one or more devices 634 in zone 600, etc. pathways 621 can include, for example, a single-mode fiber optic cable connection that communicatively couples rack computer systems 602 to an external main distribution frame via network switch device 603 and pathways 606, 613, and pathways 621 can include a multi-mode fiber optic cable connection that communicatively couples console systems of the rack computer systems 602 and network switch device 603 to one or more external elements via pathways 640, 648 and console switch devices 634.

In some embodiments, the illustrated interfaces 607, 609, 611 of the components 602, 603 are located on one or more sides of the components. The illustrated components 602, 603 may include the interfaces 607, 609, 611 on respective side ends which face towards an open aisle space, as discussed above with reference to at least FIG. 5. In some embodiments, one or more of the interfaces are located on other ends of one or more of the components, including top ends, bottom ends, and side ends which face away from an open aisle space of the computer zone 600 in which the components 602, 603 are installed.

In some embodiments, one or more portions of computer zone 600, including transverse bridge 630, is at least partially comprised in one or more of the computer zones 106, 200, 300, 500 and traverse bridges 120, 207, 310, 400, 510 illustrated and described above with reference to one or more of FIG. 1-5.

Figure 7:
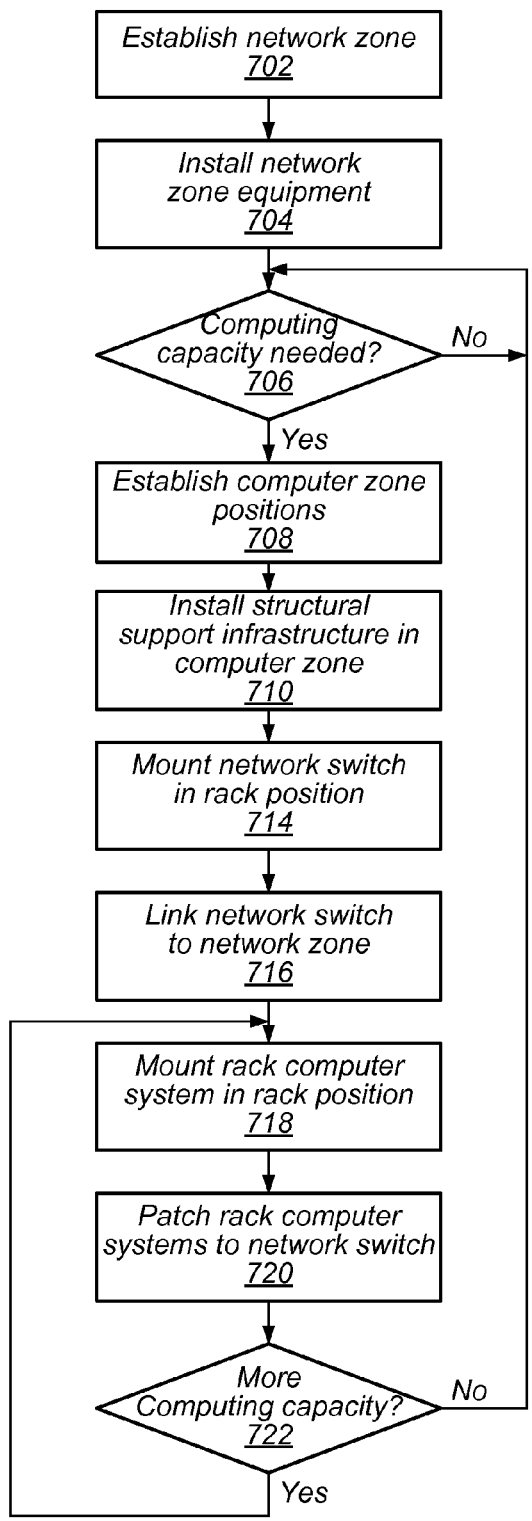
FIG. 7 illustrates installing rack computer systems in a data center via just-in-time infrastructure, according to some embodiments.

FIG. 7 illustrates installing rack computer systems in a data center via just-in-time infrastructure according to some embodiments. Such installing may be implemented with respect to one or more computer zones, network zones, rack positions, etc. illustrated and discussed with reference to one or more of FIG. 1-6.

At 702, a network zone (also referred to as a "network row") is established in a data center. The network zone can comprise one or more rows of rack positions in which components can be installed. Such components which can be installed in the network zone can include central communication components associated with computing capacity in a data center. Demarcation points, demarcation point racks, main distribution frames, master OOB management devices, master console routers, master routers, and various communication aggregation devices. Establishing a network zone can include defining a region of an interior enclosure of a data center structure as the network zone and defining one or more portions of the region as rack positions.

At 704, one or more instances of network zone equipment are installed in the network zone. Such instances of equipment can include one or more network zone components, including one or more main distribution frames, demarcation points, demarcation racks, master routers, master console routers, master OOB management devices, some combination thereof, or the like. Such components can be installed in one or more racks, which can be installed in one or more rack positions in the network zone. Installation can include mounting the components in one or more rack positions in the network zone, electrically coupling the components to a power supply, communicatively coupling one or more of the components with a communication network, etc.

At 706, a determination is made regarding whether additional computing capacity is needed for the data center. If so, at 708, one or more computer zones are established in the data center. A computer zone can comprise one or more rows of rack positions in which components can be installed. Such components which can be installed in the network zone can include rack computer systems, network switch devices, console switch devices, OOB management devices, some combination thereof, or the like. Establishing a computer zone can include defining a region of an interior enclosure of a data center structure that is remote from the network zone as the computer zone and defining one or more portions of the region as rack positions. In some embodiments, establishing the computer zone comprises establishing two rows of rack positions which extend along opposite side ends of an aisle space.

At 710, one or more instances of structural support infrastructure are installed in the computer zone. As shown in FIG. 7, the installation of the instances of structural support infrastructure may be based at least in part upon a determination that additional computing capacity is needed in the data center. The installation, in some embodiments, is based at least in part upon a determination that additional rack computer systems which can provide the additional capacity are inbound for delivery to the data center, are received at the data center, etc. In some embodiments, the structural support infrastructure instances are installed in the computer zone concurrently with installation of one or more rack computer systems in the computer zone.

In some embodiments, the one or more instances of structural support infrastructure installed in the computer zone include one or more plenum structures which enclose air plenums which can supply cooling air to the aisle space of the computer zone, direct exhaust air away from the aisle space, some combination thereof, or the like. Structural support infrastructure can include a transverse bridge, the installation of which is described in further detail with reference to FIG. 8. Structural support infrastructure can include one or more cable trays, which can be installed to extend along and above one or more rows of rack positions in a computer zone.

At 714, one or more network switch devices are mounted in one or more rack positions in the computer zone. Where the computer zone comprises at least two rows of rack positions extending along opposite side ends of an aisle space, one or more network switch devices can be mounted in one or more rack positions in one or both of the two rows of rack positions. The network switch can be mounted concurrently with receipt of the network switch at the data center. The network switch may be ordered and received at the data center concurrently with a determination that additional computing capacity is needed.

The network switch can be installed based at least in part upon a determination that the network switch device provides an incremental amount of network communication support needed to provide the incremental needed computing capacity at the data center. For example, where an incremental computing capacity requiring 24 rack computer systems is needed at the data center, and available network switch devices can each provide network communication support for 18 rack computer systems, two network switch devices may be installed in one or more computer zones in which the rack computer systems are to be installed. In some embodiments, a network switch device occupies two adjacent rack positions, such that mounting a network switch device in the computer zone includes mounting the network switch device in two adjacent rack positions in the computer zone.

In some embodiments, a network switch device is mounted in one or more particular rack positions in a computer zone. For example, a network switch device can be mounted in one or more central rack positions that are distal from end rack positions at either end of a row of rack positions. The central rack positions may be equally spaced from the end positions, may be spaced a certain a minimum number of rack positions away from the end positions, etc.

At 716, a mounted network switch device is communicatively coupled to the network zone of the data center. Such communicative coupling can result in the network switch device being "installed" in the data center. The communicative coupling, in some embodiments, comprises installing one or more instances of cabling infrastructure in the data center. The cabling infrastructure can be installed concurrently with the mounting of the network switch in the data center, and the amount of cabling infrastructure installed can correspond to the communication requirements of the network switch device, so that no excess cabling beyond the requirements of the presently installed network switch devices is installed at any given time.

For example, where a single network switch device is mounted in a data center, one or more instances of fiber optic cables may be coupled to an interface of the network switch device and extended from the network switch device to one or more components in the network zone, including a main distribution frame, to communicatively couple the network switch device with the main distribution frame.

In some embodiments, communicatively coupling a network switch device with the network zone includes communicatively coupling the network switch device with a communication interface mounted in the computer zone. Such a communication interface can be installed in a mini-rack which is coupled to one or more instances of the structural support infrastructure in the computer zone, including one or more cable trays extending above one or more of the rows of rack positions. The mini-rack may be coupled to a portion of the cable tray that is proximate to the network switch device, so that the length of cabling needed to couple the communication interface of the mini-rack and the network switch device is minimized. The communication interface of the mini-rack may be communicatively coupled with one or more components in the network zone via one or more fiber optic cable connections.

In some embodiments, cabling infrastructure is not installed in the data center until needed to support incrementally added computing capacity, and the infrastructure is installed incrementally, in increments that correspond to the incremental computing capacity and concurrently with the installation of the incremental computing capacity. In some embodiments, the incrementally-added cabling infrastructure is the minimally-sufficient quantity of cabling that provided the minimal communicative support needed to support for the incrementally added computing capacity. As a result, excess infrastructure in the data center at any given time can be minimized, as the amount of infrastructure is added concurrently with the infrastructure actually supporting an installed rack computer system. As a result, the cabling infrastructure may be free from structured cabling infrastructure, including copper trunk assemblies, copper cable connections, etc.

At 718, one or more rack computer systems are mounted in one or more rack positions in one or more computer zones of the data center. The rack computer systems may correspond with the needed computing capacity for the data center, determined at 704, where the rack computer systems can provide some or all of the needed computing capacity. In some embodiments, the rack computer systems are the minimally-sufficient quantity of rack computer systems that satisfy the needed computing capacity, so that excess computing capacity is minimized. The one or more rack computer systems may be mounted in the rack positions concurrently with a determination that the additional computing capacity is needed, concurrently with installation of one or more network switch devices as discussed at 714 and 716, concurrently with receipt of delivery of the rack computer systems at the data center, some combination thereof, or the like.

At 720, a mounted rack computer system is communicatively coupled to the network zone of the data center via one or more installed network switch devices in the row of the computer zone in which the rack computer system is mounted. Such communicative coupling can result in the rack computer system being "installed" in the data center. The communicative coupling, in some embodiments, comprises installing one or more instances of cabling infrastructure in the data center. The cabling infrastructure can be installed concurrently with the mounting of the rack computer system in the rack position, and the amount of cabling infrastructure installed can correspond to the communication requirements of the rack computer system, so that no excess cabling beyond the requirements of the presently installed rack computer systems is installed at any given time.

For example, where a rack computer system is mounted in a row of a computer zone where a single network switch device is installed, one or more instances of patch cabling may be coupled to an interface of the network switch device and extended from the network switch device to one or more interfaces of the rack computer system, to communicatively couple the network switch device with the rack computer system. As the installed network switch device is communicatively coupled with the network zone of the data center, as discussed above, communicatively coupling the rack computer system with the network switch device communicatively couples the rack computer system with the network zone.

In some embodiments, communicatively coupling a rack computer system with the network zone includes communicatively coupling the rack computer system with one or more components in the network zone via one or more fiber optic cable connections extending from the network switch device.

As noted above, in some embodiments, cabling infrastructure is not installed in the data center until needed to support incrementally added computing capacity, and the infrastructure is installed incrementally, in increments that correspond to the incremental computing capacity and concurrently with the installation of the incremental computing capacity. In some embodiments, the incrementally-added cabling infrastructure is the minimally-sufficient quantity of cabling that provided the minimal communicative support needed to support for the incrementally added computing capacity. As a result, excess infrastructure in the data center at any given time can be minimized, as the amount of infrastructure is added concurrently with the infrastructure actually supporting an installed rack computer system. As a result, the cabling infrastructure may be free from structured cabling infrastructure, including copper trunk assemblies, copper cable connections, etc.

At 722, if additional computing capacity is needed, additional rack computer systems are installed at 718-720. If not, or if one or more of additional cabling or structural support infrastructure is needed to support the additionally needed computing capacity, the process reverts to at least 706.

Figure 8:
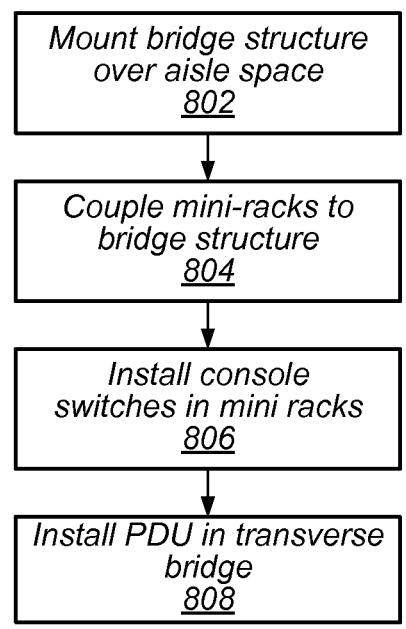
FIG. 8 illustrates installing a transverse bridge in a data center, according to some embodiments.

FIG. 8 illustrates installing a transverse bridge in a data center according to some embodiments. The installing may be part of installing structural support infrastructure in a computer zone, as described above with reference to FIG. 7. Such installing of a transverse bridge may be implemented with respect to one or more computer zones, network zones, rack positions, transverse bridges, etc. illustrated and discussed with reference to one or more of FIG. 1-6.

At 802, a bridge structure is mounted over an aisle space of a computer zone. The bridge structure may be coupled to one or more instances of structural support infrastructure in the computer zone, including one or more plenum structures, wall elements, cable trays, etc. The bridge structure may be mounted to span over the aisle space and one or more rack positions in opposite rows of the aisle space at an elevated position that is above the maximum upper elevation of rack computer systems, network switch devices, etc. which may be installed in the rack positions. In some embodiments, the bridge structure includes a cable tray structure with side ends and a bottom end.

In some embodiments, the bridge structure is mounted to span across and above a central portion of the aisle space that is distal from opposite ends of the aisle space.

At 804, one or more mini-racks are coupled to one or more portions of the bridge structure. Some multiples of mini-racks can be coupled to opposite side ends of the bridge structure. Some multiples of mini-racks can be coupled to a common side end of the bridge structure.

At 806, one or more console switch devices are installed in one or more of the mini-racks. Installation can include mounting a console switch device in one or more mounting positions in a mini-rack and communicatively coupling the console switch device with one or more components external to the mini-rack.

In some embodiments, the one or more console switch devices are installed in particular mini-racks based at least in part upon with which components, rack positions, etc. the console switch device is communicatively coupled. For example, console switch devices which are subsequently coupled with rack computer systems in a computer zone may be initially mounted in mini-racks which are coupled to a particular common side of the bridge structure, including a side which faces towards one or more installed network switch devices in the computer zone. In another example, console switch devices which are subsequently communicatively coupled with rack computer systems installed in a particular row of two opposite rows extending in the computer zone may be initially mounted in a mini-rack which is coupled to a particular portion of the bridge structure which is proximate to that particular row, relative to other mini-racks coupled to the bridge structure.

Communicatively coupling a console switch device can include engaging a communication cable, which can include one or more of a patch cable, network cable, fiber optic cable, etc., to an interface of the console switch device and extending the cable to engage with an interface of one or more of a rack computer system, network switch device, etc. in the computer zone. Communicatively coupling the console switch device can include engaging a fiber optic cable with an interface of the console switch device and extending the cable to engage with a fiber optic communication interface of a mini-rack mounted external to the transverse bridge in the computer zone, where the fiber optic communication interface is communicatively coupled to one or more components in the network zone, including a master OOB management device, master console router, etc., via another fiber optic cable connection, thereby communicatively coupling the console switch device and the communicatively coupled rack computer systems, network switch devices, etc. to the one or more components of the network zone.

At 808, one or more power distribution units (PDUs) are installed in the transverse bridge. In some embodiments, the one or more PDUs are installed in one or more of the mini-racks coupled to the bridge structure at 804. In some embodiments, one or more PDUs are coupled to a portion of the bridge structure, including one or more of an upper or lower surface of the bottom end of the bridge structure.

In some embodiments, installing a PDU in the transverse bridge comprises electrically coupling a power input interface of the PDU with a power supply, which can include an upstream component which distributes operating power from one or more power sources. For example, where an ATS assembly is installed in one or more rack positions in the computer zone, a power transmission line from an output of the ATS assembly may be extended to couple with a power inlet of the PDU in the transverse bridge, so that the PDU can receive operating power distributed by the ATS from one or more power sources.

In some embodiments, installing a PDU in the transverse bridge comprises electrically coupling a power distribution interface of the PDU with one or more of the console switch devices installed in the transverse bridge, so that the PDU distributes operating power received from one or more power sources to the one or more installed console switch devices.

In some embodiments, where separate console switch devices installed in the transverse bridge each are communicatively coupled with rack computer systems installed in separate rows of rack positions, and therefore enable remote console system access to separate rack computer systems in separate rows of the computer zone, the PDU installed in the transverse bridge can be electrically coupled to each of the console switch devices, so that the PDU distributes power to console switch devices that provide remote console system access to separate rows of rack computer systems, thereby enabling the separate console switch devices to receive operating power via a common power distribution circuit.

The various methods as illustrated in the Figures and described herein represent example embodiments of methods. The methods may be implemented in software, hardware, or a combination thereof. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A data center, comprising:
   at least two rows of rack computer systems extending along opposite side ends of an aisle space; and
   a transverse bridge spanning over the aisle space between the at least two rows above an upper elevation of the rack computer systems in each row, the transverse bridge comprising:
   a cable tray structure spanning over the aisle space between the at least two rows above the upper elevation of the rack computer systems in each row; and
   a plurality of mini-racks above the upper elevation of the rack computer systems and coupled to the cable tray structure, wherein each of at least two of the plurality of mini-racks comprises:
   at least one console switch device configured to enable remote access to console systems of rack computer systems installed in a separate one of the at least two rows of rack computer systems.

2. The data center of claim 1, wherein:
   at least one of the plurality of mini-racks comprises:
   at least one power distribution unit configured to receive power from an external power source and distribute the received power to each of the console switch devices comprised in the at least two of the plurality of mini-racks.

3. The data center of claim 2, wherein:
   each of the at least two of the mini-racks that comprise at least one console switch are coupled to a common side of the bridge structure, and the at least one of the mini-racks that comprises the power distribution unit is coupled to an opposite side of the bridge structure.

4. The data center of claim 1, wherein:
   the at least two rows of rack computer systems comprise a fiber mini-rack comprising a set of fiber optic communication interfaces, at least one of the fiber optic communication interfaces is communicatively coupled to a master console router via a fiber optic cable connection; and
   wherein, to enable remote access to console systems of rack computer systems installed in a separate one of the at least two rows of rack computer systems, each of the console switch devices is communicatively coupled to a separate fiber optic communication interface of the fiber mini-rack via another separate fiber optic cable connection.

5. A system, comprising:
   a transverse bridge configured to span between at least two rows of rack computer systems, wherein the transverse bridge comprises:
   a bridge structure configured to span an aisle space between the at least two rows; and
   at least one mini-rack above an upper elevation of the rack computer systems and coupled to the bridge structure, wherein the at least one mini-rack comprises:
   at least one console switch device configured to enable remote access to console systems of rack computer systems installed in at least one of the at least two rows of rack computer systems.

6. The system of claim 5, wherein:
   the at least one mini-rack coupled to the bridge structure comprises at least two mini-racks coupled to the bridge structure, wherein each mini-rack of the at least two mini-racks comprises a separate console switch device that is configured to enable remote access to console systems of rack computer systems installed in a separate one of the at least two rows of rack computer systems.

7. The system of claim 6, wherein:
   the transverse bridge comprises a power distribution unit, coupled to the bridge structure, which is configured to receive operating power from an external power source and distribute the operating power to each of the console switch devices comprised in the at least two mini-racks.

8. The system of claim 7, wherein:
   at least one of the at least two mini-racks comprises the power distribution unit and is coupled to the bridge structure on an opposite side of the bridge structure relative to a side to which the at least two mini-racks are both coupled.

9. The system of claim 7, wherein:
   to receive operating power from an external power source, the power distribution unit is configured to receive power from an external automatic transfer switch assembly which is configured to selectively distribute power from one of a plurality of external power sources.

10. The system of claim 5, wherein:
    to enable remote access to console systems of rack computer systems installed in at least one of the at least two rows of rack computer systems, the console switch device is configured to communicatively couple with at least one rack computer system installed in at least one of the at least two rows of rack computer systems via one or more patch cable connections; and
    the bridge structure comprises a cable tray structure configured to route the one or more patch cable connections between the console switch device and the at least one rack computer system.

11. The system of claim 5, wherein:
    the bridge structure is configured to span over the aisle space between the at least two rows of rack computer systems at an elevation that is above an upper elevation of the rack computer systems in each of the at least two rows of rack computer systems.

12. The system of claim 5, wherein:
to enable remote access to console systems of rack computer systems installed in at least one of the at least two rows of rack computer systems, the console switch device is configured to communicatively couple with a remotely-located master console router via at least one fiber optic cable connection with a fiber optic communication interface of a mini-rack coupled above at least one of the rows of rack computer systems, wherein the fiber optic communication interface is communicatively coupled with the remotely-located master console router via at least one other fiber optic cable connection.

13. The system of claim 5, wherein:
to enable remote access to console systems of rack computer systems installed in at least one of the at least two rows of rack computer systems, the console switch device is configured to communicatively couple the rack computer systems with a remotely-located master console router via a plurality of connections that are independent of copper cable connections.

14. A method, comprising:
configuring a portion of a data center, comprising at least two rows of rack positions extending along opposite side ends of an aisle space, to enable remote access to a console system of at least one rack computer system installed in at least one of the at least two rows of rack positions, wherein the configuring comprises:
mounting a transverse bridge to span the aisle space between the at least two rows of rack positions; coupling at least one mini-rack to the transverse bridge above an upper elevation of the rack positions, wherein the at least one mini-rack comprises at least one console switch device; and communicatively coupling the at least one console switch device to the at least one rack computer system.

15. The method of claim 14, wherein:
coupling at least one mini-rack to the transverse bridge comprises coupling at least two mini-racks to the transverse bridge, wherein each of the at least two mini-racks comprises a separate console switch device; and
communicatively coupling the at least one console switch device to the at least one rack computer system comprises coupling each separate console switch device with at least one rack computer system installed in a separate one of the at least two rows of rack positions.

16. The method of claim 15, wherein the configuring comprises:
installing a power distribution unit in the transverse bridge, wherein the power distribution unit is configured to receive operating power from an external power source and distribute the operating power to each of the console switch devices comprised in the at least two mini-racks.

17. The method of claim 16, wherein installing the power distribution unit in the transverse bridge comprises electrically coupling the power distribution unit with an external automatic transfer switch assembly, such that the power distribution unit is configured to receive operating power selectively distributed, by the automatic transfer switch assembly, from at least one of a plurality of external power sources.

18. The method of claim 16, wherein installing the power distribution unit in the transverse bridge comprises coupling another mini-rack to the transverse bridge and installing the power distribution unit in the other mini-rack.

19. The method of claim 14, wherein the configuring comprises:
mounting a fiber mini-rack above at least one rack position in the at least two rows, wherein the fiber mini-rack comprises a fiber optic communication interface;
communicatively coupling the fiber optic communication interface with a remote master console router via at least one fiber optic cable connection; and
communicatively coupling the at least one console switch device with the fiber optic communication interface of the fiber mini-rack via at least one other fiber optic cable connection.

20. The method of claim 19, wherein:
communicatively coupling the at least one console switch device to the at least one rack computer system comprises communicatively coupling the at least one rack computer system with a remote master console router via a communication pathway which extends between the rack computer system and the master console router independently of a network switch device, installed in at least one of the at least two rows of rack computer systems, which communicatively couples the at least one rack computer system with a remote main distribution frame via another separate communication pathway.

* * * * *